United States Patent
Tajima et al.

(10) Patent No.: US 9,575,137 B2
(45) Date of Patent: Feb. 21, 2017

(54) CONTROL APPARATUS, CONTROL METHOD, POWER SUPPLY SYSTEM, AND ELECTRIC-POWERED VEHICLE

(71) Applicant: SONY CORPORATION, Tokyo (JP)

(72) Inventors: Kimio Tajima, Tochigi (JP); Kohki Watanabe, Fukushima (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/646,674

(22) PCT Filed: Oct. 24, 2013

(86) PCT No.: PCT/JP2013/006279
§ 371 (c)(1),
(2) Date: May 21, 2015

(87) PCT Pub. No.: WO2014/083756
PCT Pub. Date: Jun. 5, 2014

(65) Prior Publication Data
US 2015/0293182 A1    Oct. 15, 2015

(30) Foreign Application Priority Data

Nov. 28, 2012 (JP) ................. 2012-260145

(51) Int. Cl.
*H02J 7/00* (2006.01)
*G01R 31/36* (2006.01)
(Continued)

(52) U.S. Cl.
CPC ............. *G01R 31/3679* (2013.01); *B60L 3/12* (2013.01); *B60L 11/1857* (2013.01); *B60L 11/1861* (2013.01); *G01R 19/16542* (2013.01); *G01R 31/362* (2013.01); *G01R 31/3606* (2013.01); *H01M 10/48* (2013.01); *H02J 7/00* (2013.01); *H02J 7/0063* (2013.01); *H01M 10/44* (2013.01); *H01M 2220/20* (2013.01); *Y02T 10/705* (2013.01); *Y02T 10/7005* (2013.01); *Y02T 10/7011* (2013.01); *Y10S 903/907* (2013.01)

(58) Field of Classification Search
CPC .......... H02J 7/00; H02J 7/0072; B60L 11/123; B60L 1/00; B60L 11/1816; H01M 10/441; B60K 6/46; B60K 6/485; G01R 31/3624
USPC . 701/22, 34.4; 320/134, 103, 109; 180/65.1; 702/63; 477/3
See application file for complete search history.

(56) References Cited

U.S. PATENT DOCUMENTS

2004/0176211 A1* 9/2004 Kitajima ................ B60K 6/485
477/3
2007/0284159 A1* 12/2007 Takami .................... B60K 6/46
180/65.1

(Continued)

FOREIGN PATENT DOCUMENTS

JP    HEI 10-253725 A    9/1998
JP    2009-252381 A    10/2009
(Continued)

*Primary Examiner* — Yuri Kan
(74) *Attorney, Agent, or Firm* — Chip Law Group

(57) ABSTRACT

A control apparatus includes, for example, an input unit to which a plurality of pieces of voltage information related to a voltage of an electric storage unit upon discharge are input, and a determination unit configured to use the voltage information in an early stage of the discharge and determine the presence or absence of a deterioration of the electric storage unit.

15 Claims, 9 Drawing Sheets

(51) Int. Cl.
*H01M 10/48* (2006.01)
*B60L 11/18* (2006.01)
*G01R 19/165* (2006.01)
*B60L 3/12* (2006.01)
*H01M 10/44* (2006.01)

(56) References Cited

U.S. PATENT DOCUMENTS

| | | | | |
|---|---|---|---|---|
| 2010/0019729 | A1* | 1/2010 | Kaita | B60L 11/123 |
| | | | | 320/134 |
| 2010/0201323 | A1* | 8/2010 | Okamura | H02J 7/0072 |
| | | | | 320/134 |
| 2011/0313613 | A1* | 12/2011 | Kawahara | H01M 10/441 |
| | | | | 701/34.4 |
| 2012/0029851 | A1* | 2/2012 | Nakayama | G01R 31/3624 |
| | | | | 702/63 |
| 2012/0326654 | A1* | 12/2012 | Ito | B60L 11/1816 |
| | | | | 320/103 |
| 2012/0326667 | A1* | 12/2012 | Ito | B60L 1/00 |
| | | | | 320/109 |

FOREIGN PATENT DOCUMENTS

| | | |
|---|---|---|
| JP | 2010-102869 A | 5/2010 |
| JP | 2010-123321 A | 6/2010 |
| WO | 2010-029863 A1 | 3/2010 |

* cited by examiner

CONTROL APPARATUS, CONTROL METHOD, POWER SUPPLY SYSTEM, AND ELECTRIC-POWERED VEHICLE

TECHNICAL FIELD

The present disclosure relates to a control apparatus, a control method, a power supply system, and an electric-powered vehicle.

BACKGROUND ART

To say nothing of various electronic devices, secondary cells are used as power supplies for automobiles and backup. A lithium-ion secondary cell using the doping and de-doping of lithium ions is widely known as one of the secondary cells. The lithium-ion secondary cell may change in properties due to the use environment and the use time. Hence, various proposals have been made for detecting the state of a lithium-ion secondary cell. For example, the following Patent Document 1 describes a technology for using the ratio of the amount of a change in the voltage of the lithium-ion secondary cell to a change in the electric storage amount of the lithium-ion secondary cell (dV/dQ) to determine the presence or absence of a deterioration of the lithium-ion secondary cell.

CITATION LIST

Patent Document

Patent Document 1: JP 2009-252381 A

SUMMARY OF THE INVENTION

Problems to be Solved by the Invention

The technology described in Patent Document 1 needs to obtain a plurality of feature points such as a maximum value and a minimum value using the ratio of the amount of a change in the voltage of a lithium-ion secondary cell to a change in the electric storage amount of the lithium-ion secondary cell (dV/dQ). Hence, there is a problem that the process of detecting the state of the lithium-ion secondary cell takes time.

Therefore, one object of the present disclosure is to provide a control apparatus, control method, power supply system, and electric-powered vehicle that quickly detect a deterioration of a secondary cell such as a lithium-ion secondary cell.

Solutions to Problems

To achieve the above object, the present disclosure is, for example, a control apparatus including:

an input unit to which a plurality of pieces of voltage information related to a voltage of an electric storage unit upon discharge are input; and a determination unit configured to use the voltage information in an early stage of the discharge and determine the presence or absence of a deterioration of the electric storage unit.

The present disclosure can also be configured as, for example, an electric-powered vehicle including the control apparatus.

The present disclosure is, for example, a control method in a control apparatus, the control method including:

a plurality of pieces of voltage information related to a potential of an electric storage unit upon discharge being input; and using the voltage information in an early stage of the discharge and determining the presence or absence of a deterioration of the electric storage unit.

The present disclosure is, for example, a power supply system including:

one or a plurality of electric storage units;

an output unit configured to acquire a voltage of the electric storage unit upon discharge, and output voltage information related to the acquired voltage;

an input unit to which a plurality of pieces of the voltage information are input; and a determination unit configured to use the voltage information in an early stage of the discharge and determine the presence or absence of a deterioration of the electric storage unit.

Effects of the invention

According to at least one embodiment, a deterioration of a secondary cell such as a lithium-ion secondary cell can be detected quickly.

MODE FOR CARRYING OUT THE INVENTION

Figure 1:
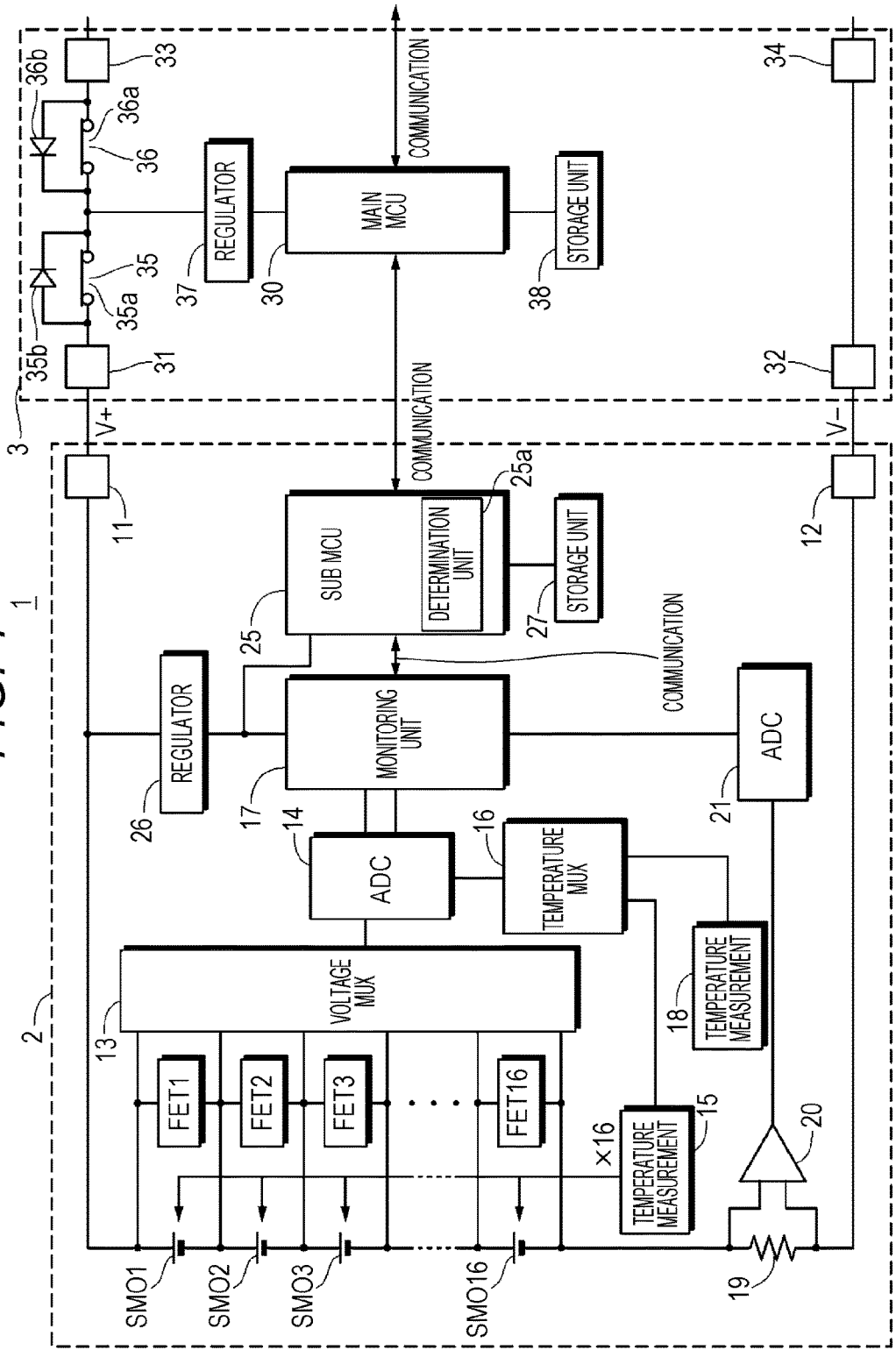
FIG. 1 is a block diagram illustrating an example of the configuration of a power supply system.

Hereinafter, an embodiment and modifications of the present disclosure are described with reference to the drawings. A description is given in the following order:

<1. One Embodiment>
<2. First Modification of the Embodiment>
<3. Second Modification of the Embodiment>
<4. Third Modification of the Embodiment>
<5. Other Modifications>
<6. Application Examples>

The embodiment and the like described below are preferred specific examples of the present disclosure. The contents of the present disclosure are not limited by the embodiment and the like.

<1. One Embodiment>
[Example of Lithium-Ion Secondary Cell]

An example of a cell to be used in the present disclosure is a lithium-ion secondary cell including a positive electrode active material and a carbon material such as graphite as a negative electrode active material. There is no particular restriction on the positive electrode material. However, the positive electrode material preferably contains a positive electrode active material having the olivine structure.

More preferably, the positive electrode active material having the olivine structure is preferably a lithium iron phosphate compound ($LiFePO_4$) or a lithium iron complex phosphate compound ($LiFe_xM_{1-x}O_4$: M is one or more kinds of metal, and x is $0<x<1$) containing a heteroatom. Here, "main constituent" indicates 50% or more of the total mass of the positive electrode active material of a positive electrode active material layer. Moreover, if M is two or more kinds, they are selected in such a manner as that the sum total of numerical subscripts is 1−x.

M may include a transition element, an element in Group IIA, an element in Group IIIA, an element in Group IIIB, and an element in Group IVB. Especially, it is preferable to contain at least one of cobalt (Co), nickel, manganese (Mn), iron, aluminum, vanadium (V), and titanium (Ti).

In terms of the positive electrode active material, a coating layer containing a metal oxide (for example, a selection from Ni, Mn, and Li) or a phosphate compound (for example, lithium phosphate), which has a different composition from that of the lithium iron phosphate compound or lithium iron complex phosphate compound, may be applied to a surface of the oxide.

Lithium complex oxides such as a lithium cobalt oxide ($LiCoO_2$), a lithium nickel oxide ($LiNiO_2$), and a lithium manganese oxide ($LiMnO_2$), which have the layered rock-salt structure, and a lithium manganese oxide having the spinel structure ($LiMn_2O_4$) may be used as the positive electrode material that can occlude and release lithium (Li).

There is no particular restriction on graphite in the present disclosure. A wide range of graphite materials used in the industry can be used. Lithium titanate, a silicon (Si)-based material, a tin (Sn)-based material, and the like may be used as the material of the negative electrode.

There is no particular restriction on a method for manufacturing electrodes of the cell according to the present disclosure. A wide range of methods used in the industry can be used.

There is no particular restriction on the cell configuration in the present disclosure. A wide range of known configurations can be used.

There is no particular restriction on an electrolyte used for the present disclosure. A wide range of electrolytes used in the industry, including liquid and gel electrolytes, can be used.

An electrolyte solvent is, preferably, 4-fluoro-1,3-dioxolan-2-one (FEC), ethylene carbonate, propylene carbonate, butylene carbonate, vinylene carbonate (VC), dimethyl carbonate, diethyl carbonate, ethyl methyl carbonate, γ-butyrolactone, γ-valerolactone, 1,2-dimethoxyethane, tetrahydrofuran, 2-methyltetrahydrofuran, 1,3-dioxolane, 4-methyl-1,3-dioxolane, methyl acetate, methyl propionate, ethylpropionate, acetonitrile, glutaronitrile, adiponitrile, methoxyacetonitrile, 3-methoxypropironitrile, N,N-dimethylformamide, N-methylpyrrolidone, N-methyl oxazolidinone, nitromethane, nitroethane, sulfolane, dimethylsulfoxide, trimethyl phosphate, triethyl phosphate, ethylene sulfide, or trimethyl-hexyl ammonium bis (trifluoromethylsulfonyl) imide and, more preferably, 4-fluoro-1,3-dioxolan-2-one (FEC), ethylene carbonate, propylene carbonate, butylene carbonate, vinylene carbonate (VC), dimethyl carbonate, diethyl carbonate, ethyl methyl carbonate, γ-butyrolactone, or γ-valerolactone.

A supporting electrolyte is, preferably, lithium hexafluorophosphate ($LiPF_6$), lithium bis(pentafluoroethanesulfonyl)imide ($Li(C_2F_5SO_2)_2N$), lithium perchlorate ($LiClO_4$), lithium hexafluoroarsenate ($LiAsF_6$), lithium tetrafluoroborate ($LiBF_4$), lithium trifluoromethanesulfonate ($LiSO_3CF_3$), lithium bis(trifluoromethanesulfonyl)imide ($Li(CF_3SO_2)_2N$), or lithium tris(trifluoromethanesulfonyl)methyl ($LiC(SO_2CF_3)_3$).

The lithium-ion secondary cell can be classified into prismatic, cylindrical, and the like according to the shape. In the embodiment and modifications of the present disclosure, cylindrical lithium-ion secondary cells are used as an example. One cylindrical lithium-ion secondary cell is referred to as a cell, as appropriate. The voltage of the lithium-ion secondary battery cell is, for example, approximately 3.2 V. The full charge voltage of the cell is, for example, approximately 4.2 V, and its capacity is 3 Ah (ampere-hour) (3000 mAh (milliampere-hour).

One formed by connecting a plurality of cells is referred to as a submodule, as appropriate. The submodule has, for example, a configuration in which eight cells are connected in parallel. The voltage of the submodule is approximately 3.2 V, which is substantially the same as the voltage of the cell, and its capacity is approximately 24 Ah.

One formed by connecting a plurality of submodules is referred to as an electric storage block, as appropriate. The electric storage block is formed by, for example, connecting 16 submodules in series. Furthermore, a plurality of electric storage blocks may be connected. It is possible to respond to the demands for large capacity and high power by connecting a plurality of electric storage blocks. The number of cells forming a submodule and the connection form of cells can be changed, as appropriate. Furthermore, the number of submodules forming an electric storage block and the connection form of submodules can be changed, as appropriate.

An electric storage module includes one or a plurality of electric storage blocks and a peripheral circuit. One or a plurality of electric storage modules is connected to a controller. A module controller (referred to as the sub micro control unit, as appropriate) of the electric storage module is connected to a main micro control unit of the controller, for example, via a bus. For example, a serial interface is used as the bus. Specifically, a System Management Bus (SM bus), a Controller Area Network (CAN), a Serial Peripheral Interface (SPI), or the like is used.

The sub micro control unit communicates with the main micro control unit. Information on the internal state of each electric storage module, for example, information on the voltage of each submodule, information on the voltage of the electric storage block, information on current, information on the temperature of each submodule, and information on the temperature of the electric storage block, is transmitted from the sub micro control unit to the main micro control unit. The main micro control unit controls the charge and discharge of the electric storage module in accordance with these pieces of information.

The contents of processes respectively performed by the sub micro control unit and the main micro control unit can be set, as appropriate. For example, the sub micro control unit may control the charge and discharge of the electric storage block autonomously.

[Configuration of Power Supply System]

FIG. 1 is a block diagram illustrating an example of the configuration of a power supply system. A power supply system 1 has a configuration including, for example, an electric storage module 2 and a controller 3. Electric power is transmitted and communication is performed between the electric storage module 2 and the controller 3. FIG. 1 illustrates only one electric storage module. However, it may be configured in such a manner as that a plurality of electric storage modules is connected and each electric storage module is connected to the controller. In a case of such a configuration, for example, the positive and negative terminals of the lowest electric storage module are connected to the controller 3. Power and a control command are transmitted from a higher electric storage module via a lower electric storage module, or conversely, from a lower electric storage module via a higher electric storage module.

The controller 3 is connected to a load and a charging device (their illustrations are omitted) via a power cable and a bus for communication. The power of the electric storage module 2 is supplied to the load via the controller 3. The load connected to the controller 3 is, for example, an inverter circuit for a motor system of an electric vehicle, or a home power system.

[Configuration of Electric Storage Module]

An example of the configuration of the electric storage module 2 is described. Each unit forming the electric storage module 2 is housed in, for example, an outer case of a predetermined shape. The outer case is desired to use a material having high conductivity and emissivity. The excellent heat dissipation character of the outer case can be obtained by use of the material having high conductivity and emissivity. An increase in temperature inside the outer case can be suppressed by obtaining the excellent heat dissipation character. Furthermore, an opening of the outer case can be minimized or eliminated and accordingly, high dust-proof and drip-proof properties can be achieved. For the outer case, a material such as aluminum, aluminum alloy, copper, or copper alloy is used.

The electric storage module 2 is formed including, for example, a positive terminal 11, a negative terminal 12, an electric storage block, Field Effect Transistors (FETs), a voltage multiplexer (Multiplexer (MUX)) 13, an Analog to Digital Converter (ADC) 14, a temperature measurement unit 15, a temperature multiplexer 16, a monitoring unit 17, a temperature measurement unit 18, a current detection resistor 19, a current detection amplifier 20, an ADC 21, a sub micro control unit 25, a regulator 26, and a storage unit 27.

The electric storage block is formed by connecting one or a plurality of submodules SMO being an example of an electric storage unit. The submodule SMO is, for example, eight cylindrical lithium-ion secondary cells connected in parallel. As an example, the electric storage block is formed by connecting 16 submodules SMO1, SMO2, SMO3, SMO4 . . . SMO16 in series. If there is no need to distinguish the individual submodules, the submodules are referred to as the submodule SMO, as appropriate.

A positive electrode side of the submodule SMO1 is connected to the positive terminal 11 of the electric storage module 2. A negative electrode side of the submodule SMO16 is connected to the negative terminal 12 of the electric storage module 2. The positive terminal 11 is connected to a positive terminal of the controller 3. The negative terminal 12 is connected to a negative terminal of the controller 3.

In accordance with the configuration of the 16 submodules SMO, 16 FETs (FET1, FET2, FET3, FET4 . . . FET16) are provided between the terminals of the submodules SMO. The FETs are, for example, for performing passive cell balancing control.

The outline of cell balancing control to be performed by the FETs is described. For example, it is assumed that the deterioration of the submodule SMO2 progressed as compared to the other submodules SMO, and the internal impedance of the submodule SMO2 has increased. If the electric storage module 2 is charged in this state, the submodule SMO2 is not charged to a normal voltage due to the increase of the internal impedance. Hence, fluctuations in the balance of voltages between submodules SMO occur.

In order to solve the fluctuations in the balance of voltages between the submodules SMO, the FETs but the FET2 are turned on, and the submodules SMO but the submodule SMO2 are discharged to a predetermined voltage value. The FETs are turned off after the discharge. After the discharge, the voltage of each submodule SMO reaches, for example, a predetermined value (for example, 3.0 V (volt), and the submodules SMO are balanced. The cell balancing control method is not limited to the passive method. However, what is called the active method and other known methods can be applied.

If the voltage across the terminals of the submodule SMO is detected by a voltage detection unit (its illustration is omitted). The voltage across the terminals of the submodule SMO is detected regardless of, for example, during charge or discharge. In a determination process described below, the voltage of each submodule SMO is detected by the voltage detection unit at intervals of, for example, 250 ms (millisecond) upon the discharge of the electric storage module 2.

The voltage (analog voltage data) of each submodule SMO detected by the voltage detection unit is supplied to the voltage multiplexer 13. In this example, the electric storage block is composed of 16 submodules SMO. Accordingly, 16 pieces of analog voltage data are supplied to the voltage multiplexer 13.

The voltage multiplexer 13 switches channels at, for example, predetermined intervals, and selects one piece of analog voltage data from the 16 pieces of analog voltage data. The one piece of analog voltage data selected by the voltage multiplexer 13 is supplied to the ADC 14. The voltage multiplexer 13 then switches channels and supplies the next piece of analog voltage data to the ADC 14. In other words, the 16 pieces of analog voltage data are supplied from the voltage multiplexer 13 to the ADC 14 at the predetermined intervals.

Channels are switched by the voltage multiplexer 13 in accordance with control by the sub micro control unit 25 of the electric storage module 2 or the main micro control unit of the controller 3.

The temperature measurement unit 15 detects the temperature of each submodule SMO. The temperature measurement unit 15 includes an element that detects a temperature, such as a thermistor. The temperature of the submodule SMO is detected at predetermined intervals regardless of, for example, during charge or discharge.

Analog temperature data indicating the temperature of each submodule SMO detected by the temperature measurement unit 15 is supplied to the temperature multiplexer 16. In the example, the electric storage module is composed of 16 submodules SMO. Accordingly, 16 pieces of analog temperature data are supplied to the temperature multiplexer 16.

The temperature multiplexer 16 switches channels, for example, at predetermined intervals, and selects one piece of analog temperature data from the 16 analog temperature data. The one piece of analog temperature data selected by the temperature multiplexer 16 is supplied to the ADC 14. The temperature multiplexer 16 then switches channels and supplies to the next piece of analog temperature data to the ADC 14. In other words, the 16 pieces of analog temperature data are supplied from the temperature multiplexer 16 to the ADC 14 at the predetermined intervals.

Channels are switched by the temperature multiplexer 16 in accordance with control by the sub micro control unit 25 of the electric storage module 2 or the main micro control unit of the controller 3.

The ADC 14 converts the analog voltage data supplied from the voltage multiplexer 13 into digital voltage data. The ADC 14 converts the analog voltage data into, for example, 14- to 18-bit digital voltage data. Various methods such as a successive approximation method and a $\Delta\Sigma$ (delta-sigma) method can be applied to the conversion method in the ADC 14.

The ADC 14 includes, for example, an input terminal, an output terminal, a control signal input terminal to which a control signal is input, and a clock pulse input terminal to which a clock pulse is input (the illustrations of these terminals are omitted). The analog voltage data is input into the input terminal. The digital voltage data after conversion is output from the output terminal.

For example, a control signal (control command) supplied from the controller 3 is input into the control signal input terminal. The control signal is, for example, an acquisition instruction signal to instruct the acquisition of the analog voltage data supplied from the voltage multiplexer 13. When the acquisition instruction signal has been input, the analog voltage data is acquired by the ADC 14. The acquired analog voltage data is converted into digital voltage data. The digital voltage data is then output via the output terminal in accordance with a clock pulse for synchronization input into the clock pulse input terminal. The output digital voltage data is supplied to the monitoring unit 17.

Furthermore, an acquisition instruction signal to instruct the acquisition of the analog temperature data supplied from the temperature multiplexer 16 is input into the control signal input terminal. The ADC 14 acquires the analog temperature data in accordance with the acquisition instruction signal. The acquired analog temperature data is converted by the ADC 14 into digital temperature data. The analog temperature data is converted into, for example, 14- to 18-bit digital temperature data. The converted digital temperature data is output via the output terminal. The output digital temperature data is supplied to the monitoring unit 17. It may be configured in such a manner as to separately provide ADCs respectively processing voltage data and temperature data. A functional block of the ADC 14 may have the function of a comparator that compares a voltage and a temperature with predetermined values.

For example, the 16 pieces of digital voltage data and the 16 pieces of digital temperature data are time-division-multiplexed and transmitted from the ADC 14 to the monitoring unit 17. An identifier to identify the submodule SMO may be described in the header of the transmitted data to indicate that the voltage and temperature are related to which submodule SMO. In the example, the digital voltage data of each submodule SMO, which was obtained at the predetermined intervals and has been converted by the ADC 14 into digital data, corresponds to voltage information. The analog voltage data may be set as the voltage information. The digital voltage data on which a correction process and the like have been performed may be set as the voltage information.

The temperature measurement unit 18 measures the temperature of the entire electric storage module 2. The temperature inside the outer case of the electric storage module 2 is measured by the temperature measurement unit 18. The analog temperature data measured by the temperature measurement unit 18 is supplied to the temperature multiplexer 16, and then supplied from the temperature multiplexer 16 to the ADC 14. The analog temperature data is then converted by the ADC 14 into digital temperature data. The digital temperature data is supplied from the ADC 14 to the monitoring unit 17.

The electric storage module 2 includes a current detection unit that detects the value of a current (load current) flowing through a current path of the electric storage module 2. The current detection unit detects the value of a current flowing through the 16 submodules SMO. The current value varies depending on the load connected to the electric storage module 2. The current detection unit includes, for example, the current detection resistor 19 connected between the negative electrode side of the submodule SMO16 and the negative terminal 12, and the current detection amplifier 20 connected to both ends of the current detection resistor 19. The current detection resistor 19 detects analog current data. The analog current data is detected at predetermined intervals regardless of, for example, during charge or discharge.

The detected analog current data is supplied to the current detection amplifier 20. The analog current data is amplified by the current detection amplifier 20. The gain of the current detection amplifier 20 is set to, for example, approximately 50 to 100 times. The amplified analog current data is supplied to the ADC 21.

The ADC 21 converts the analog current data supplied from the current detection amplifier 20 into digital current data. The ADC 21 converts the analog current data into, for example, 14- to 18-bit digital current data. Various methods such as a successive approximation method and a $\Delta\Sigma$ (delta-sigma) method can be applied to the conversion method in the ADC 21.

The ADC 21 includes, for example, an input terminal, an output terminal, a control signal input terminal to which a control signal is input, and a clock pulse input terminal to which a clock pulse is input (the illustrations of these terminals are omitted). The analog current data is input into the input terminal. The digital current data is output from the output terminal.

For example, a control signal (control command) supplied from the controller 3 is input into the control signal input terminal of the ADC 21. The control signal is, for example, an acquisition instruction signal to instruct the acquisition of the analog current data supplied from the current detection amplifier 20. When the acquisition instruction signal has been input, the analog current data is acquired by the ADC 21. The acquired analog current data is converted into digital current data. The digital current data is then output from the output terminal in accordance with a clock pulse for synchronization input into the clock pulse input terminal. The output digital current data is supplied to the monitoring unit 17. The digital current data is an example of the current information. The ADCs 14 and 21 maybe configured as the same ADC.

The monitoring unit 17 monitors the digital voltage data and the digital temperature data, which are supplied from the ADC 14, and monitors the presence or absence of an anomaly of the submodule SMO. For example, if the voltage indicated by the digital voltage data is around 4.2 V, which is an index of overcharge, or around 2.0 V to 2.7 V, which is an index of over-discharge, an anomaly notification signal indicating that there is an anomaly or a risk of the occurrence of an anomaly is generated. Furthermore, the monitoring unit 17 generates an anomaly notification signal also in a case where the temperature of the submodule SMO or the temperature of the entire electric storage module 2 is greater than a threshold value.

Furthermore, the monitoring unit 17 monitors the digital current data supplied from the ADC 21. The monitoring unit 17 generates an anomaly notification signal if the current value indicated by the digital current data is greater than a threshold value. The anomaly notification signal generated by the monitoring unit 17 is transmitted to the sub micro control unit 25 by a communication function of the monitoring unit 17.

The monitoring unit 17 monitors the presence or absence of the above-mentioned anomaly, and also transmits, to the sub micro control unit 25, the digital voltage data of each of the 16 submodules SMO supplied from the ADC 14 and the digital current data supplied from the ADC 21. The digital voltage data of each submodule SMO and the digital current data may be supplied directly to the submicro control unit 25, bypassing the monitoring unit 17. The transmitted digital voltage data of each submodule SMO and digital current data are input into the sub micro control unit 25. The digital temperature data supplied from the ADC 21 maybe configured to be supplied from the monitoring unit 17 to the sub micro control unit 25.

The sub micro control unit 25 being an example of the control apparatus includes a Central Processing Unit (CPU) having a communication function, and controls each unit of the electric storage module 2. For example, when having been supplied with the anomaly notification signal from the monitoring unit 17, the sub micro control unit 25 uses the communication function and notifies the anomaly to the main micro control unit (a main micro control unit 30) of the controller 3. The main micro control unit 30 executes a process such as stopping charge or discharge in accordance with the notification, as appropriate. The expressions of sub and main in the sub micro control unit and the main micro control unit are for convenience of description, and do not have any special meanings.

Two-way communication pursuant to a standard such as I2C, System Management Bus (SMBus), Serial Peripheral Interface (SPI), or CAN, which is a serial communication standard, is performed between the sub micro control unit 25 and the main micro control unit 30. Communication may be wired or wireless.

The digital voltage data is input by the monitoring unit 17 into the sub micro control unit 25. For example, the digital voltage data of each submodule SMO upon the discharge of the electric storage module 2 is input into the sub micro control unit 25.

Furthermore, the magnitude of a load current (digital current data) of when the load is connected to the electric storage module 2 is input by the monitoring unit 17 into the sub micro control unit 25. The digital temperature data indicating the temperature of each submodule SMO or the temperature inside the electric storage module 2 may be input into the sub micro control unit 25.

The sub micro control unit 25 includes a determination unit 25a as the function. The determination unit 25a determines the presence or absence of a deterioration occurring when the submodule SMO is used under a predetermined environment.

Charging the lithium-ion secondary cell at 0° C. or below is generally prohibited. However, there is also a case, for example, where the lithium-ion secondary cell is used at low temperatures of 0° C. to approximately minus (−) 10° C. to be charged. If charging the lithium-ion secondary cell at low temperatures is repeated, metal lithium is precipitated on the surface of the negative electrode of the lithium-ion secondary cell and accordingly the performance of the lithium-ion secondary cell deteriorates. If discharge is performed in a state where the metal lithium has been precipitated on the surface of the negative electrode, the voltage (potential) of the lithium-ion secondary cell indicates specific behavior. The determination unit 25a determines the presence or absence of a deterioration of the submodule SMO composed of lithium-ion secondary cells by, for example, detecting the presence or absence of the behavior. The determination process by the determination unit 25a is described in detail below.

If the determination unit 25a has determined that there is a deterioration in any of the submodules SMO, the sub micro control unit 25 performs a predetermined notification process. For example, the sub micro control unit 25 transmits an alarm signal to the main micro control unit 30 of the controller 3. The main micro control unit 30, which has received the alarm signal, prohibits the charge and discharge of the electric storage module 2 at an appropriate timing. A display or beep tone may be used to perform the process of notifying a user of the deterioration of the electric storage module 2.

The regulator 26 is connected to, for example, a line between the positive electrode side of the submodule SMO1 and the positive terminal 11, reduces the voltage output from the electric storage block, and generates a voltage for operating each unit of the electric storage module 2. The regulator 26 includes, for example, a series regulator. The voltage generated by the regulator 26 is supplied to, for example, the monitoring unit 17 and the sub micro control unit 25. The voltage generated by the regulator 26 may be supplied to the ADC 14, the ADC 21, and the like.

The storage unit 27 includes Read Only Memory (ROM) and Random Access Memory (RAM). For example, a program to be executed by the sub micro control unit 25 is stored in the storage unit 27. Furthermore, the storage unit 27 is used as a work area for the sub micro control unit 25 to execute processes.

Furthermore, a discharge curve corresponding to the magnitude of a discharge current is stored in the storage unit 27. The sub micro control unit 25 reads, from the storage unit 27, a discharge curve corresponding to the digital current data supplied from the ADC 21, and acquires a reference voltage from the discharge curve. The sub micro control unit 25 may be configured to acquire the reference voltage via, for example, a network. It may be configured in such a manner as that the sub micro control unit 25 transmits the value of a discharge current to the controller 3, and a reference voltage in accordance with the value of the discharge current is supplied from the controller 3 to the sub micro control unit 25.

[Configuration of Controller]

Next, an example of the configuration of the controller 3 is described. As described above, the controller 3 is for, for example, controlling the charge and discharge of one or a plurality of electric storage modules 2. The controller 3 is formed including an outer case similarly to, for example, the electric storage module 2.

The controller 3 is formed including the main micro control unit 30, a positive terminal 31, a negative terminal 32, a positive terminal 33, a negative terminal 34, a charge control unit 35, a discharge control unit 36, a regulator 37, and a storage unit 38.

The positive terminal 31 is connected to the positive terminal 11 of the electric storage module 2. The negative terminal 32 is connected to the negative terminal 12 of the electric storage module 2. Upon the discharge of the electric storage module 2, the positive terminal 33 and the negative terminal 34 are respectively connected to positive and negative terminals of the load. Upon the charge of the electric storage module 2, the positive terminal 33 and the negative terminal 34 are respectively connected to positive and negative terminals of a power supply (charging) device.

The main micro control unit 30 includes, for example, a CPU having a communication function, and controls each unit of the controller 3. The main micro control unit 30 controls charge and discharge in accordance with the anomaly notification signal transmitted from the sub micro control unit 25 of the electric storage module 2. For example, if a risk of overcharge is notified by the anomaly notification signal, the main micro control unit 30 turns off at least a switching element of the charge control unit 35, and stops charging. For example, if a risk of over-discharge is notified by the anomaly notification signal, the main micro control unit 30 turns off at least a switching element of the discharge control unit 36, and stops discharging.

For example, if information to the effect that there is a deterioration in the submodule SMO is notified by an alarm signal, the main micro control unit 30 turns off the switching elements of the charge control unit 35 and the discharge control unit 36, and stops the use of the electric storage module 2. For example, if the electric storage module 2 is used as a backup power supply, the use of the electric storage module 2 is not stopped immediately, but stopped at an appropriate timing.

The controller 3 can communicate with a CPU and the like of the load. An anomaly of the electric storage module 2 may be notified to the CPU of the load.

The charge control unit 35 includes a charge control switch 35a, and a diode 35b connected in parallel with the charge control switch 35a in a forward direction with respect to the discharge current. The discharge control unit 36 includes a discharge control switch 36a, and a diode 36b connected in parallel with the discharge control switch 36a in a forward direction with respect to the charge current. For example, an Insulated Gate Bipolar Transistor (IGBT) and a Metal Oxide Semiconductor Field Effect Transistor (MOSFET) can be used as the charge control switch 35a and the discharge control switch 36a. The charge control unit 35 and the discharge control unit 36 may be inserted into a negative power supply line.

The regulator 37 uses, for example, the voltage of the electric storage module 2 to generate a voltage for operating the main micro control unit 30. The voltage generated by the regulator 37 causes the main micro control unit 30 to operate. The voltage generated by the regulator 37 may be supplied to the storage unit 38 and the like.

The storage unit 38 includes ROM and RAM. For example, a program to be executed by the main micro control unit 30 is stored in the storage unit 38. The storage unit 38 is used as a work area for the main micro control unit 30 to execute processes.

[Regarding Changes in Voltage]

Figure 2:
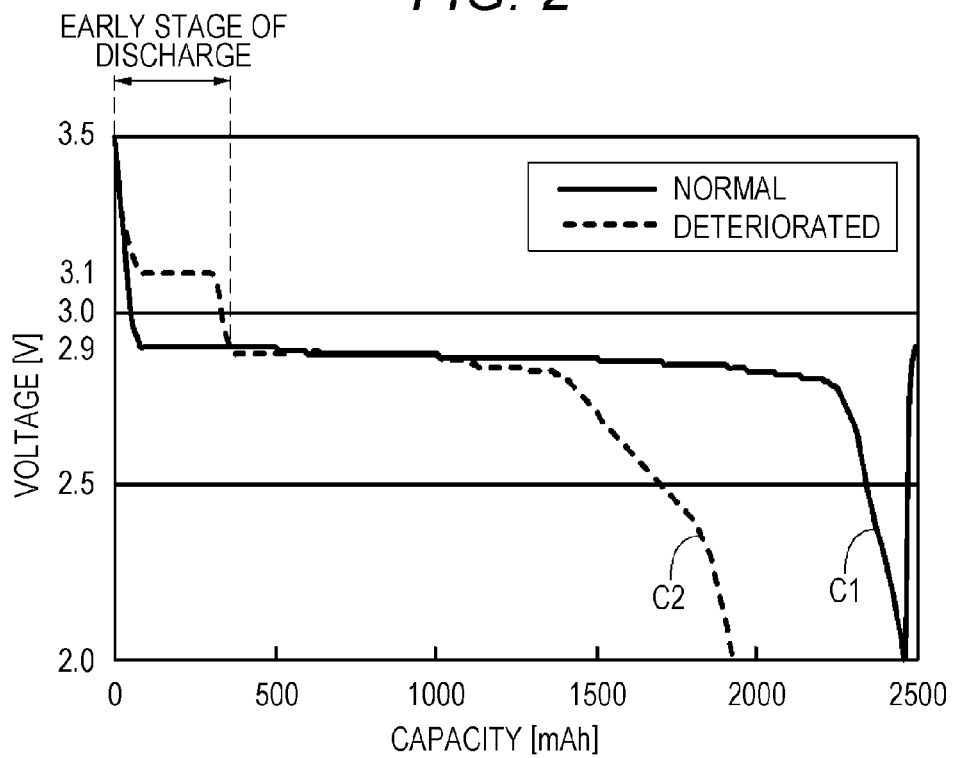
FIG. 2 is a diagram illustrating an example of changes in voltage against changes in capacity upon discharge.

FIG. 2 illustrates an example of a discharge curve of a lithium-ion secondary battery cell. The vertical axis indicates the voltage of the cell. The horizontal axis indicates the capacity of the cell. The discharge curve delineates a curve that is different depending on the discharge current. Hence, a reference voltage described below varies depending on the discharge current.

A solid-line curve C1 in FIG. 2 indicates a discharge curve of a normal cell. The curve C1 is stored in, for example, the storage unit 27. A dotted-line curve C2 indicates a discharge curve of a cell in which metal lithium was precipitated on the surface of the negative electrode and a deterioration has occurred. As described above, if charge at low temperatures (for example, between $-10°$ C. and $0°$ C.) is repeated, metal lithium is precipitated on the surface of the negative electrode of the lithium-ion secondary cell.

The curves C1 and C2 indicate changes in the voltage of the cell of, for example, when the electric storage block is charged in such a manner as that the voltage of the cell reaches a predetermined voltage (for example, approximately 3.5 V), and the load is then connected to start discharging the electric storage block. The voltage of the submodule SMO also changes as in the voltage of the cell. The cell may be charged to increase the voltage to a full charge voltage (for example, 4.2 V). The voltage drops due to the connection of the load, and a predetermined discharge current (load current) flows. The discharge current is detected by the current detection unit (the current detection resistor 19 and the current detection amplifier 20).

If the cell is normal, the voltage drops from 3.5 V to around 2.9 V due to the connection of the load. The voltage subsequently reaches a plateau (flat) where approximately 2.9 V is maintained, and gradually drops. The voltage (2.9 V) corresponding to the plateau is an example of the reference voltage. If the voltage falls to and below a predetermined value (for example, 2.0 V), it leads to over-discharge. Accordingly, the discharge is stopped and the electric storage module 2 is removed from the load. In the curve C1, a spot where the voltage increases from around 2.0 V to around 3.0 V represents an increase in voltage in accordance with the removal of the load.

If a deterioration is occurring in the cell, the voltage drops due to the connection of the load as in the normal case. However, the voltage does not drop to the reference voltage, but drops to a greater voltage (for example, 3.1 V) than the reference voltage. After passing through a spot of a high potential where the voltage is 3.1 V, the voltage drops to the reference voltage (2.9 V). After reaching a plateau where approximately 2.9 V is maintained, then the voltage gradually drops. If there is a deterioration in the cell, the capacity (discharge capacity) is reduced.

The appearance of the spot of the high potential of 3.1 V in the curve C2 can be considered to result from the following reason: if charge is repeated at low temperatures, metal lithium is precipitated on the surface of the negative electrode of the lithium-ion secondary cell, and it enters a state as if the metal lithium is used as the negative electrode. Here, the metal lithium indicates the lowest potential among the elements. Therefore, the potential difference between the positive electrode and the negative electrode is apparently increased and accordingly the high potential spot is considered to occur. With the progress of the discharge, the metal lithium on the surface of the negative electrode dissolves and the voltage drops from 3.1 V to 2.9 V being the reference voltage.

If the eight cells deteriorate, the high potential spot is similarly detected also in the voltage of the submodule SMO. In other words, as an example, the voltage of the submodule SMO is monitored. As a result, if the high potential spot is detected in the early stage of discharge, it can be determined that there is a deterioration in the submodule SMO.

The early stage of discharge is assumed to be, for example, until the passage of a predetermined period after the start of discharge. The predetermined period can be set, as appropriate. For example, it is set to approximately one second. The early stage of discharge may be defined by the State Of Charge (SOC) of the cell or submodule SMO. For example, the early stage of discharge may be defined as a period including a period during which the SOC is greater than 80%. "Greater than 80%" may be understood to be 80% or more, or may be understood to be a value exceeding 80%. The same shall apply to the description "greater than" in other parts.

The period including the period during which the SOC is greater than 80% is preferably a period during which the SOC is from 80% to 100%. As in a period during which the SOC is from 85% to 95%, the minimum is not necessarily required to be 80%, and the maximum to be 100%.

Figure 3:
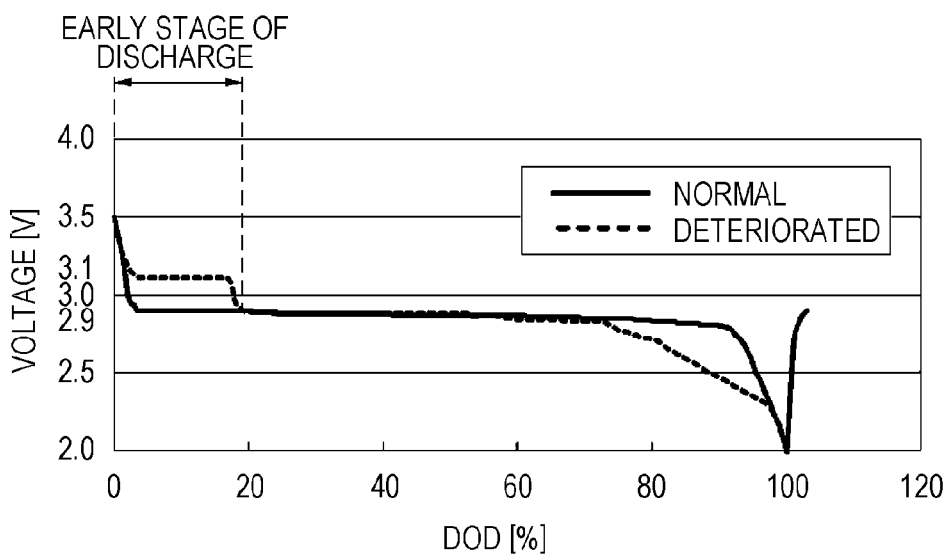
FIG. 3 is a diagram illustrating an example of changes in voltage against changes in DOD upon discharge.

Furthermore, as illustrated in FIG. 3, the early stage of discharge may be defined by the Depth Of Discharge (DOD) of the cell or submodule SMO. For example, the early stage of discharge may be defined as a period including a period during which the DOD is less than 20%. "Less than 20%" may be understood to be 20% or less, or may be understood to be below 20%. The same shall apply to the description "less than" in other parts.

The period including the period during which the DOD is less than 20% is preferably a period during which the DOD is from 0% to 20%. As in a period during which the DOD is from 5% to 15%, the minimum is not necessarily required to be 0%, and the maximum to be 20%.

The meaning of SOC includes the degree of charge, in other words, the ratio of the charged capacity to the nominal capacity expressed in percentage. Moreover, the meaning of DOD includes the depth of discharge, in other words, the ratio of the discharge capacity to the rated capacity expressed in percentage.

[Flow of Process]

Figure 4:
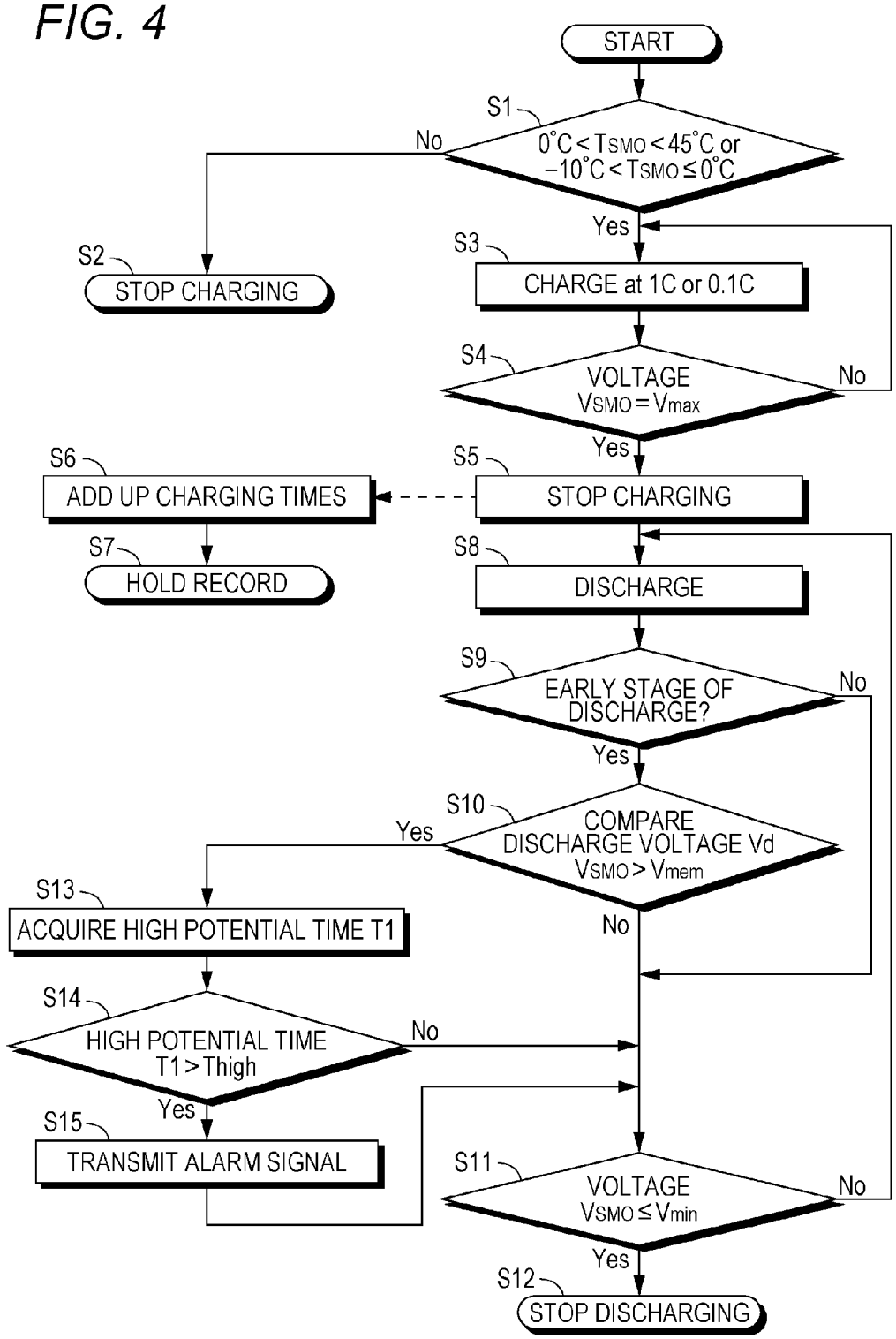
FIG. 4 is a flowchart illustrating an example of the flow of a process.

FIG. 4 is a flowchart illustrating an example of the flow of the determination process. The charge process and the discharge process in the determination process are performed on, for example, the electric storage block (the 16 submodules SMO), and controlled by the controller 3.

In Step S1, it is judged whether or not a temperature $T_{SMO}$ of the submodule SMO is within a range of the following (1) or (2). The temperature $T_{SMO}$ of the submodule SMO is a temperature measured by the temperature measurement unit 15. In the example, 16 temperatures $T_{SMO}$ are acquired.

$$0° C. < T_{SMO} < 45° C. \quad (1)$$

$$-10° C. < T_{SMO} \leq 0° C. \quad (2)$$

If the temperature $T_{SMO}$ of any of the submodules SMO is not within the ranges of (1) and (2), the processing proceeds to Step S2. In Step S2, the charge process is stopped. When charge is performed if the temperature $T_{SMO}$ of the submodule SMO is not within the ranges of (1) and (2), the submodule SMO may deteriorate. Accordingly, the charge process is stopped.

If the temperatures $T_{SMO}$ of all the 16 submodules SMO are within the ranges of (1) and (2), the processing proceeds to Step S3. In Step S3, the electric storage block is charged at a predetermined charge rate. When the electric storage module 2 is charged, for example, a charging device including a Direct Current (DC)-DC converter connected to the controller 3 is used.

1C charge or 0.1C charge is performed on the electric storage module 2. Here, "1C charge" indicates, for example, a charge operation at such a charge current (that is, 1000 mA) as to complete charge in one hour if the capacity of the lithium-ion secondary cell is 1000 mAh. 0.1C indicates a charge operation at such a charge current as to complete charge in 10 hours. The charge rate is controlled by, for example, the controller 3.

During the charge, the voltage of each submodule SMO is acquired at predetermined intervals. The voltages of the 16 submodules SMO (the 16 pieces of digital voltage data) acquired at a certain timing are transmitted from the sub micro control unit 25 to the main micro control unit 30. The processing then proceeds to Step S4.

In the determination of Step S1, if the temperature $T_{SMO}$ of the submodule SMO is $-10° C. < T_{SMO} \leq 0° C.$, the charge operation at a low current of 0.1C is desired to be performed. Charge at lower temperatures is performed at the low current. Accordingly, it is possible in the charge process to prevent metal lithium from being newly precipitated on the surface of the negative electrode.

In Step S4, a highest voltage $V_{SMO}$ among the voltages $V_{SMO}$ of the 16 submodules SMO is judged whether or not to have reached a voltage $V_{max}$. The judgment is made by, for example, the main micro control unit 30. The voltage $V_{max}$ is set to, for example, 3.5 V. The voltage $V_{max}$ may be set to a voltage beyond which charge is no longer preferable (for example, a full charge voltage of approximately 4.2 V).

If the highest voltage $V_{SMO}$ has not reached the predetermined voltage $V_{max}$, the processing returns to Step S3, and the charge is continued. The judgment in Step S4 is made for the voltage $V_{SMO}$ of the submodule SMO acquired at the next timing. If the highest voltage $V_{SMO}$ has reached the predetermined voltage $V_{max}$, the processing proceeds to Step S5.

In Step S5, the main micro control unit 30 instructs the charging device to stop the charge operation. In the example, the record of charge is configured to be held additionally. The record of charge is, for example, a summation of charging times of when the temperature $T_{SMO}$ of the submodule SMO is $-10° C. < T_{SMO} \leq 0° C.$ The number of charges of when the temperature $T_{SMO}$ of the submodule SMO is $-10° C. < T_{SMO} \leq 0° C.$ may be configured to be held as the record of charge.

In Step S6, the charging times are added up. In Step S7, the added time is held as the record. The processes in Steps S6 and S7 are performed by, for example, the controller 3. The record of charge is stored in the storage unit 38. The processes in Steps S6 and S7 may be performed on the electric storage module 2 side.

After the charge is stopped in Step S5, the processing proceeds to Step S8. In Step S8, the load is connected to the controller 3 to discharge the electric storage block. When the discharge has been started, the discharge current is measured by the current detection resistor 19. The measured discharge current is supplied to the sub micro control unit 25 via the current detection amplifier 20, the ADC 21, and the like.

The sub micro control unit 25 reads a discharge curve corresponding to the discharge current from the storage unit 27, and acquires a reference voltage $V_{mem}$ from the read discharge curve. When the discharge of the electric storage module 2 has been started, the voltages $V_{SMO}$ of the 16 submodules SMO (the 16 pieces of digital voltage data) are input as the voltage information into the sub micro control unit 25 at intervals of, for example, 250 ms. The processing then proceeds to Step S9.

In Step S9, it is judged whether or not to be in the early stage of discharge. An example of setting the early stage of discharge has already been described. Therefore, the overlapping description is omitted. If it is in the early stage of discharge, the processing proceeds to Step S10. If it is not in the early stage of discharge, the processing proceeds to Step S11. If it is not in the early stage of discharge, there is no need to perform the processes of Steps S10, S13, S14, and S15 and accordingly the discharge may be stopped.

In Step S10, the sub micro control unit 25 compares the highest voltage $V_{SMO}$ among the input voltages $V_{SMO}$ of the submodules SMO with the reference voltage $V_{mem}$.

In the comparison process of Step S10, if the voltage $V_{SMO}$ of the submodule SMO is not greater than the reference voltage $V_{mem}$, the processing proceeds to Step S11. In Step S11, the lowest voltage $V_{SMO}$ among the voltages $V_{SMO}$ of the 16 submodules SMO is compared with a voltage $V_{min}$. The voltage $V_{min}$ is set to a voltage beyond which discharge is no longer preferable (for example, 2.0 V). The voltage $V_{min}$ may be set to a predetermined voltage (for example, approximately 2.5 V).

In the determination process of Step S11, if the voltage $V_{SMO}$ is equal to or less than the voltage $V_{min}$, the processing proceeds to Step S12, and the discharge is stopped. In the determination process of Step S11, if the voltage $V_{SMO}$ is greater than the voltage $V_{min}$, the processing returns to Step S8, and the discharge is continued.

In the comparison process of Step S10, if the highest voltage $V_{SMO}$ of the submodule SMO is greater than the reference voltage $V_{mem}$ (high potential), the processing proceeds to Step S13. In Step S13, the process of acquiring a time (high potential time) T1 during which the voltage $V_{SMO}$ of the submodule SMO is greater than the reference voltage $V_{mem}$ is performed. The high potential time T1 can be acquired by, for example, the number of positive acknowledgements in the determination process of Step S10 and an interval (sampling interval) for the measurement of the voltage $V_{SMO}$ of the submodule SMO. When the high potential time T1 has been acquired, the processing proceeds to Step S14.

In Step S14, the sub micro control unit 25 judges whether or not the high potential time T1 is greater than a threshold value $T_{high}$. The threshold value $T_{high}$ is appropriately set to a value that can determine a deterioration of the submodule SMO correctly. If the high potential time T1 is less than the threshold value $T_{high}$, the processing proceeds to Step S11.

If the high potential time T1 is greater than the threshold value $T_{high}$, it is determined that there is a deterioration in the submodule SMO. The processing then proceeds to Step S15. In Step S15, the process of notifying the deterioration of the submodule SMO is performed. For example, the sub micro control unit 25 transmits an alarm signal to the main micro control unit 30. The main micro control unit 30, which has received the alarm signal, performs the process of notifying a user of the anomaly (deterioration) of the electric storage module 2 with a sound, display, or the like, and encourages the user to, for example, check or replace the electric storage module 2.

As described above, as an example, a high potential period in the early stage of discharge is detected and accordingly a deterioration of a submodule, and by extension a deterioration of an electric storage module using the submodule can be detected. The voltage of the submodule SMO in the early stage of discharge is simply required to be monitored, and a deterioration of the submodule SMO can be detected quickly.

The determination process of FIG. 4 is performed at predetermined intervals, for example, at the start of the power supply system 1, or during the operation of the power supply system 1. The record (log) that can be obtained in the processes in Steps S6 and S7 may be referred to judge whether or not to perform the determination process. In other words, it may be configured in such a manner as that the record is referred to and, if at least one of the number of charges and the charging time at low temperatures (for example, at $-10°$ C.$<T_{SMO}\leq 0°$ C.) is greater than a threshold value, the determination process is performed.

<2. First Modification of the Embodiment>

Next, a first modification of the embodiment is described. In the embodiment, it is configured in such a manner as that the high potential period in the early stage of discharge is detected to detect a deterioration of a submodule. In the first modification, if there is a deterioration of a submodule, the degree (rate) of the deterioration of the submodule is further judged.

Figure 5:
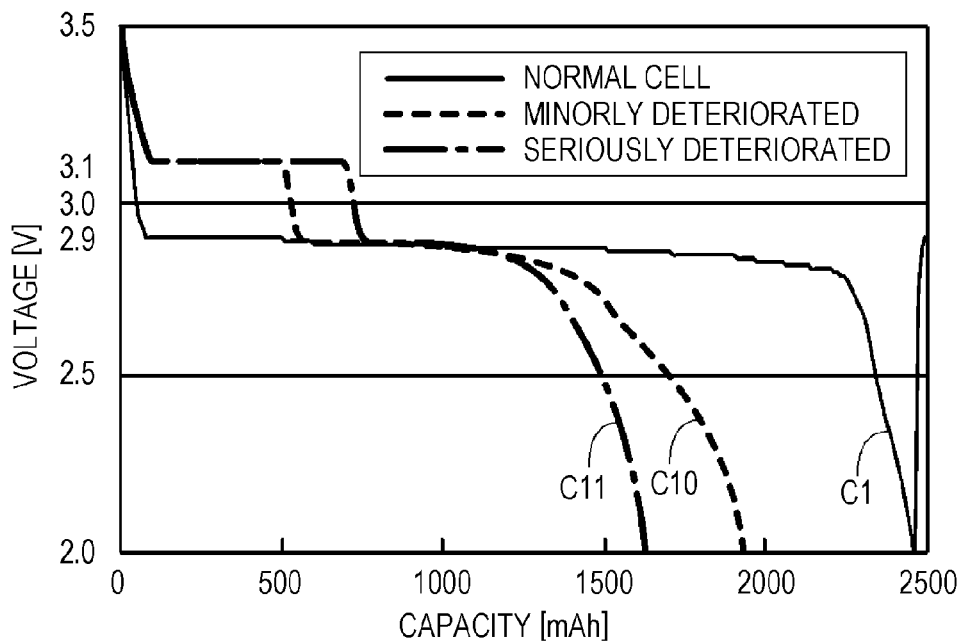
FIG. 5 is a diagram for illustrating that a discharge curve changes in accordance with the degree of a deterioration of a submodule.

FIG. 5 illustrates an example of a discharge curve of a cell. As described with reference to FIG. 2, a discharge curve of when the cell is normal delineates a curve indicated by the curve C1. Here, as described in the embodiment, if there is a deterioration of the cell, a discharge curve of the deteriorated cell delineates, for example, a curve indicated by a dotted-line curve C10.

Here, if charge is repeated at $0°$ C. or below, metal lithium precipitated on the surface of the negative electrode does not dissolve and accumulates. Accordingly, the deterioration of the cell progresses. A discharge curve of the cell where the deterioration has progressed delineates, for example, a curve indicated by a dot-and-dash-line curve C11. As indicated by the curve C11, as the deterioration of the cell progresses, the high potential time is elongated.

The phenomenon in which the high potential time is elongated is considered to be based on the following reason: if the deterioration of the cell progresses, the amount of metal lithium accumulated on the surface of the negative electrode increases. Accordingly, it takes time for the metal lithium to dissolve upon the discharge of the electric storage module 2. The high potential time is considered to be elongated since it takes time for the metal lithium to dissolve.

In other words, the degree of the deterioration of the cell can be judged in accordance with the magnitude of the high potential time T1. Similarly, the high potential time T1 of the submodule SMO having the deteriorated cell is also elongated. For example, apart from the threshold value $_{high}$ for determining the presence or absence of a deterioration of the submodule SMO, a second threshold value (however, the second threshold value has a greater value than the threshold value$_{high}$) is set. If the high potential time T1 exceeds the second threshold value, the degree of deterioration is judged to be high, and the result is notified. A plurality of second threshold values may be set to judge the degree of deterioration more minutely.

The charge and discharge of the electric storage module 2 may be configured to be forcedly prohibited if the degree of deterioration is high. The process of judging the degree of deterioration is performed by, for example, the sub micro control unit 25. As described above, if there is a deterioration in the submodule SMO, the process of judging the degree of the deterioration may be further performed.

<3. Second Modification of the Embodiment>

Next, a second modification of the embodiment is described. In the embodiment, the presence or absence of a deterioration of the submodule SMO is determined in accordance with the magnitude of the high potential time T1. In the second modification, the ratio of a change in capacity ($\Delta Q$) to a change in voltage ($\Delta V$) (referred to as $\Delta Q/\Delta V$, as appropriate) is used to determine the presence or absence of a deterioration of the submodule SMO. The change in capacity ($\Delta Q$) is acquired at, for example, predetermined intervals (for example, 250 ms). The change in capacity ($\Delta Q$) can be acquired by the product of the discharge current and the elapsed time.

Figure 6:
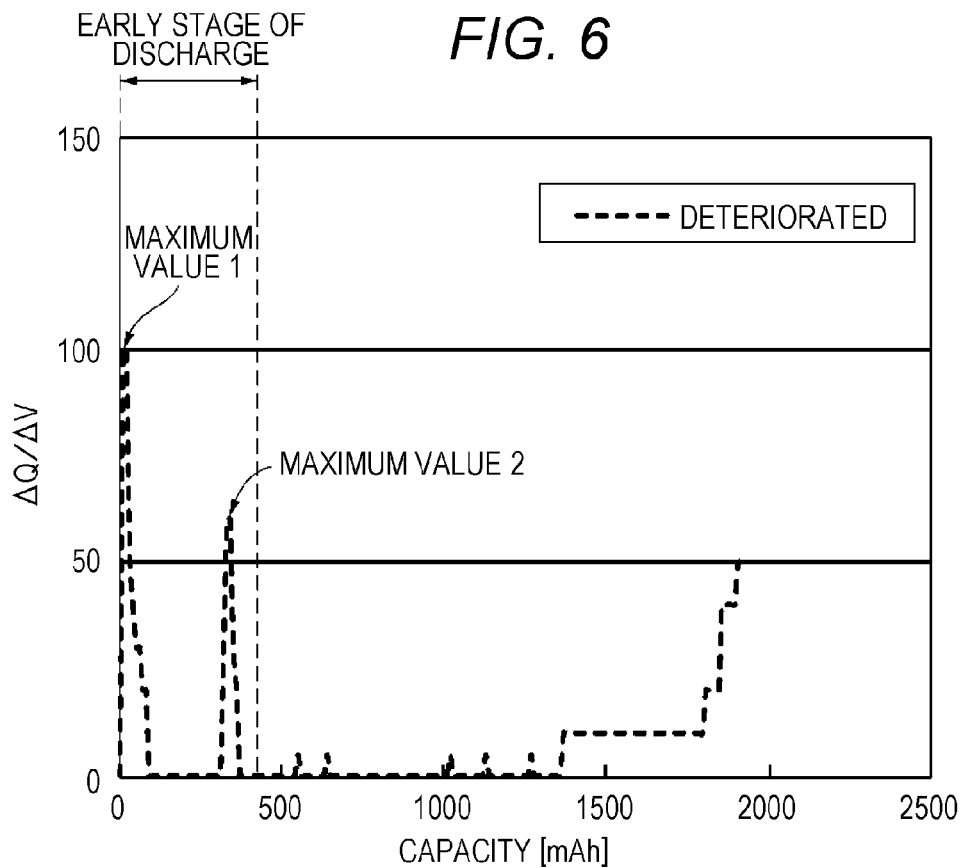
FIG. 6 is a diagram illustrating an example of changes in $\Delta Q/\Delta V$ against changes in capacity upon discharge.

FIG. 6 is a graph illustrating an example of changes in $\Delta Q/\Delta V$ of a cell in which a deterioration occurred. As illustrated, a maximum value 1 and a maximum value 2, which exceed a threshold value (for example, 50), appear in the early stage of discharge. The maximum value 1 corresponds to a drop in the voltage of the cell of when the load is connected to the electric storage module 2. The maximum value 2 corresponds to the dissolution of metal lithium precipitated on the surface of the negative electrode and a drop in the voltage of the cell from the high potential to the reference voltage.

If the cell is normal, there is no high potential period. Accordingly, the maximum value 2 does not appear in the changes in $\Delta Q/\Delta V$. In other words, the presence or absence of the maximum value 2 is judged and, if the maximum value 2 is detected, it can be determined that there is a deterioration in the cell. If the cell has deteriorated, the maximum value 2 is similarly detected in the changes in $\Delta Q/\Delta V$ of the submodule SMO.

Figure 7:
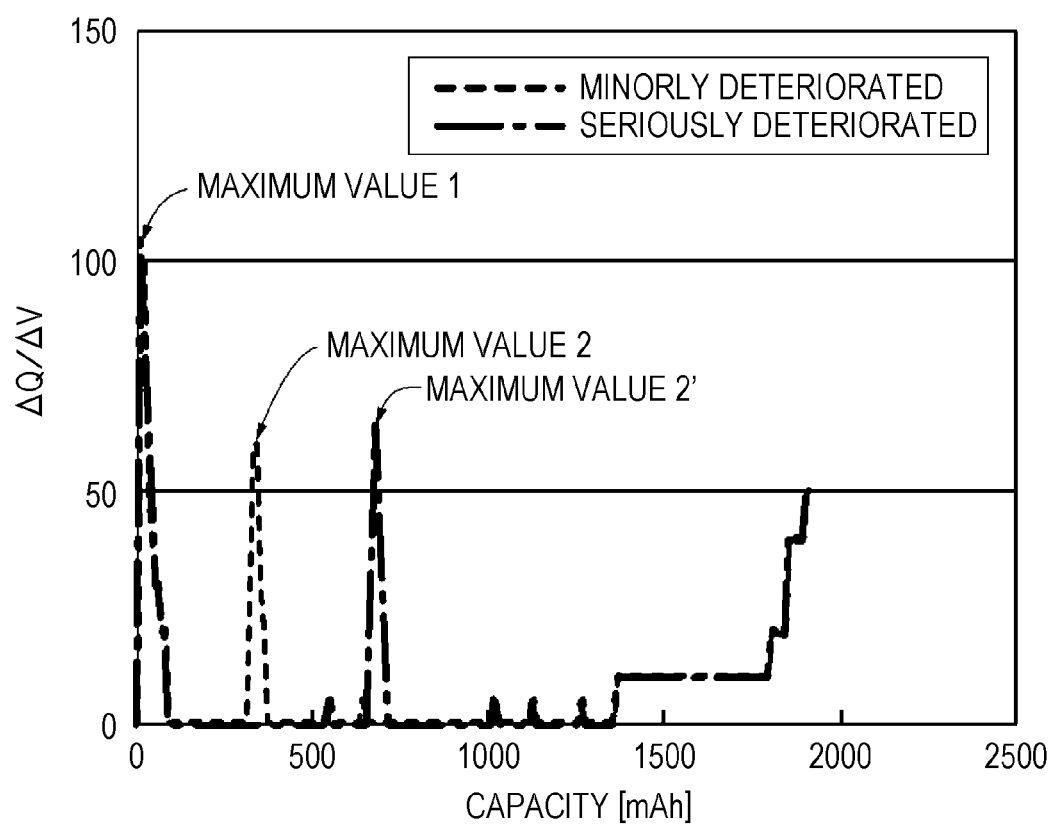
FIG. 7 is a diagram for illustrating that a timing when the maximum value is detected changes in accordance with the degree of the deterioration of the submodule.

In the second modification of the embodiment, the degree of the deterioration can be further determined. The elongation of the high potential time with the progress of the deterioration of the submodule SMO is as already described. A timing when the voltage of the submodule SMO shifts from the high potential to the reference voltage shifts to a temporally later timing by the elongation of the high potential time. FIG. 7 indicates such shifts in accordance with the changes in $\Delta Q/\Delta V$. A timing when the maximum value 2 is detected shifts to a temporally later timing if the deterioration of the submodule SMO progresses. In FIG. 7, a maximum value of when the degree of the deterioration of the submodule SMO is high is illustrated as a maximum value 2e. In other words, the degree of the deterioration of the submodule SMO can be determined in accordance with the timing when the maximum value 2 is detected.

<4. Third Modification of the Embodiment>

Next, a third modification of the embodiment is described. In the embodiment, the presence or absence of a deterioration of the submodule SMO is configured to be determined by the electric storage module. In the third modification, the presence or absence of a deterioration of the submodule SMO is determined by the controller.

Figure 8:
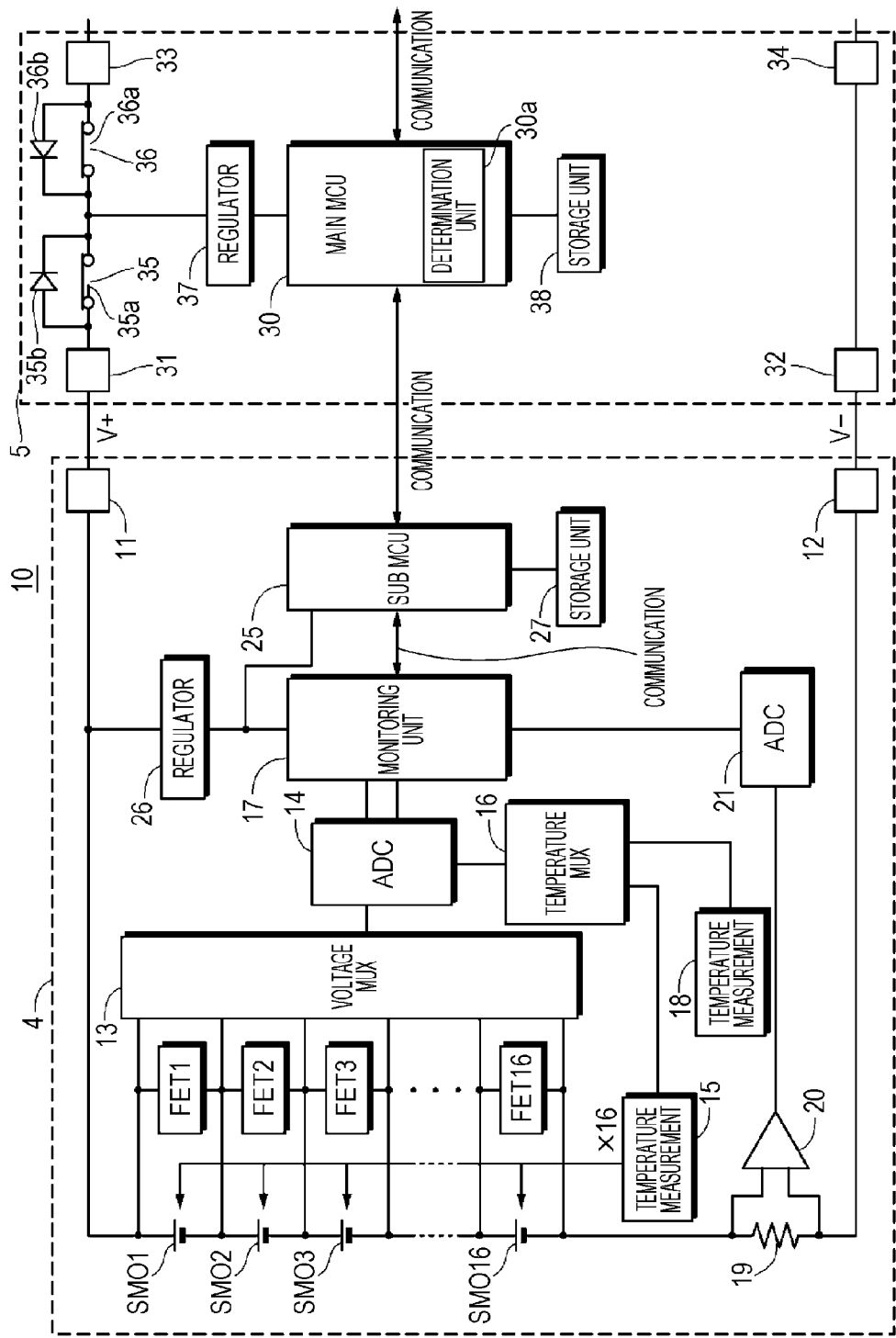
FIG. 8 is a block diagram illustrating another example of the configuration of the power supply system.

FIG. 8 illustrates an example of the configuration of a power supply system 10 in the third modification. In FIG. 8, common reference numerals are assigned to configurations which are the same or corresponding configurations of the power supply system 1 in the embodiment. The power supply system 10 is formed including an electric storage module 4 and a controller 5.

In the third modification, the presence or absence of a deterioration of the submodule SMO is configured to be determined by the controller 5. In other words, the main micro control unit 30 of the controller 5 has the function of the determination unit 25a of the sub micro control unit 25. The main micro control unit 30 has a determination unit 30a as the function. A discharge curve of the normal submodule SMO is stored in the storage unit 38, corresponding to the discharge current. The main micro control unit 30 uses the discharge curve stored in the storage unit 38 to acquire the reference voltage.

The other configurations are the same as those of the power supply system 1, the electric storage module 2, and the controller 3 in the embodiment. Accordingly, the overwrapping descriptions are omitted.

The voltage information of the submodule SMO acquired in the electric storage module 4 is supplied from the sub micro control unit 25 to the main micro control unit 30. The main micro control unit 30 uses the input voltage information to determine the presence or absence of a deterioration of the submodule SMO. The methods described in the embodiment and the modifications can be applied to the method for determining a deterioration of the submodule SMO. Furthermore, the degree of the deterioration of the submodule SMO may be configured to be determined. In this manner, the presence or absence of a deterioration of the submodule SMO may be configured to be determined on the controller side in the power supply system. In other words, the configuration corresponding to the control apparatus in the claims may be the sub micro control unit 25 or the main micro control unit 30.

In the power supply system, the output unit in the claims includes, for example, the voltage detection unit, the voltage multiplexer 13, the ADC 14, and the monitoring unit 17. The configuration corresponding to the input unit and the determination unit in the claims may be the sub micro control unit 25 or the main micro control unit 30.

<5. Other Modifications>

Up to this point the embodiments of the present disclosure have been specifically described. However, the present disclosure is not limited to the above-mentioned embodiments, and various modifications can be made based on the technical idea of the present disclosure.

Figure 9:
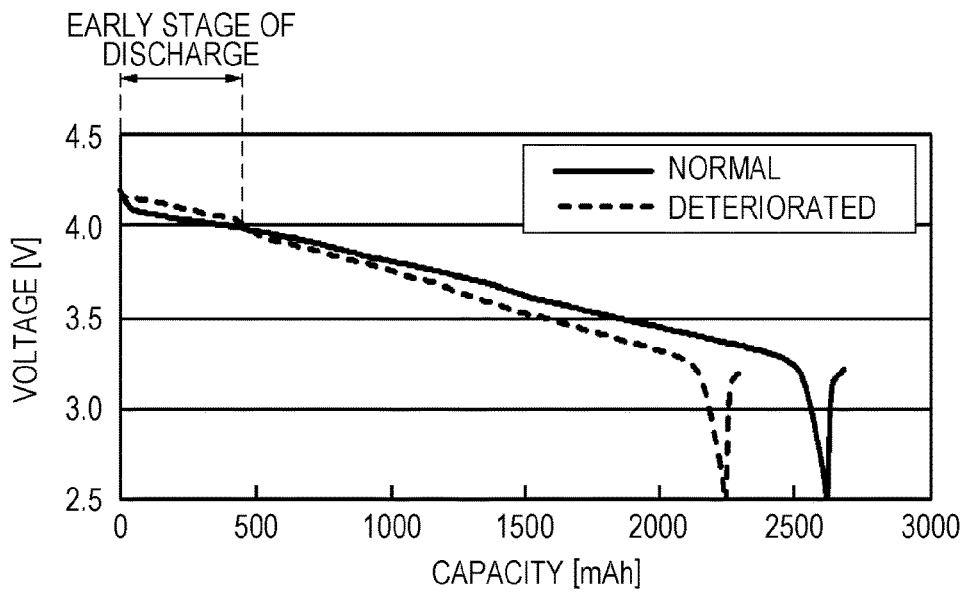
FIG. 9 is a diagram illustrating another example of changes in voltage against changes in capacity upon discharge.
Figure 10:
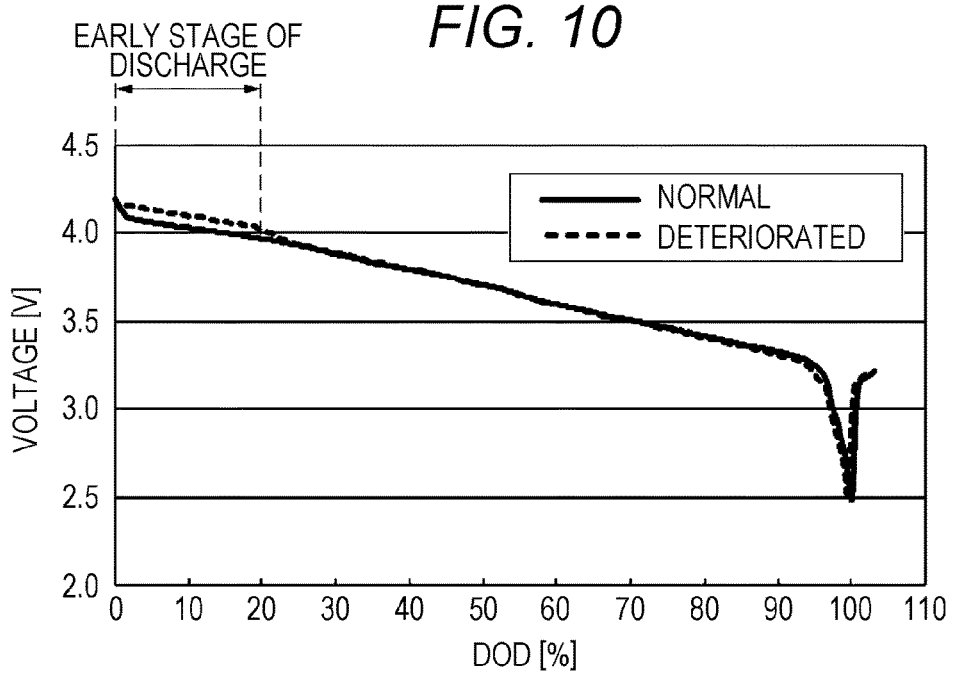
FIG. 10 is a diagram illustrating another example of changes in voltage against changes in DOD upon discharge.

For example, a cobalt-based or nickel-based material may be used as the positive electrode material of the lithium-ion secondary cell. As illustrated in FIGS. 9 and 10, even if a lithium-ion secondary cell that uses a cobalt-based or nickel-based material deteriorates, a high potential (for example, 4.15 V to 4.2 V) is detected in the early stage of discharge. As long as it is a secondary cell in which a high potential appears in the early stage of discharge with the deterioration of the performance, the present disclosure can be applied whatever the material and whatever the structure.

The electric storage unit is not limited to a submodule composed of a plurality of lithium-ion secondary battery cells. For example, a lithium-ion secondary battery cell included in a submodule may be set as the electric storage unit, or one or a plurality of electric storage blocks may be set as the electric storage unit. The configuration of the electric storage unit can be set in accordance with the size of the power supply system, as appropriate.

The deterioration determination target can be changed in accordance with the configuration of the electric storage unit, as appropriate. In the above-mentioned embodiments, it is configured in such a manner as that the voltages of the submodules are monitored to determine the presence or absence of a deterioration on a submodule basis. However, the presence or absence of a deterioration may be configured to be determined on a cell or electric storage block basis. Furthermore, the temperature may be measured on a cell basis. The average of the temperatures of eight cells may be set as the temperature of the submodule.

If charge and discharge are possible on a submodule basis, the process of determining a deterioration of the submodule may be sequentially performed on a submodule basis. Furthermore, the presence or absence of a deterioration may be notified on a submodule basis.

In the process of determining a deterioration of the submodule, it may be configured in such a manner as that differential voltages between the voltage indicated by the discharge curve stored in the storage unit and the voltage of the submodule are added up and, if the integrated value reaches a threshold value or more, it is determined that there is a deterioration of the submodule.

The present disclosure can also be applied to a case of detecting a deterioration of the electric storage unit in a system (for example, a power supply system for a hybrid vehicle) used within a range of the SOC from 100% to 40%.

It may be configured in such a manner as that the internal resistance of the submodule is measured to determine the presence or absence of a deterioration of the submodule in combination with information on the measured internal resistance. For example, it may be configured to determine that there is a deterioration of the submodule if the high potential time continues for a threshold value or more, and the internal resistance is equal to or more than a threshold value. The accuracy of the determination of the presence or absence of a deterioration of the submodule can be improved in combination with the information on the internal resistance.

The configurations, methods, steps, shapes, materials, numerical values, and the like cited in the above-mentioned embodiments are simply used as examples. Configurations, methods, steps, shapes, materials, numerical values, and the like that are different from them may be used if necessary. Moreover, the configurations, methods, steps, shapes, materials, numerical values, and the like in the embodiments can be combined with one another within a scope that does not cause a technical contradiction.

The present disclosure can also be applied to what is called a cloud system in which the processes illustrated by example are distributed and performed by a plurality of devices. The present disclosure can be realized as an apparatus that is a system that executes the processes illustrated by example in the embodiment and the modifications, in which at least part of the processes illustrated by example is executed.

Furthermore, the present disclosure is not limited to an apparatus, but can be realized as, for example, a method, a program, or a recording medium in which a program is recorded.

The present disclosure can take the following configurations.

(1)
A control apparatus including:
an input unit to which a plurality of pieces of voltage information related to a voltage of an electric storage unit upon discharge are input; and
a determination unit configured to use the voltage information in an early stage of the discharge and determine the presence or absence of a deterioration of the electric storage unit.

(2)
The control apparatus according to (2), wherein the early stage of the discharge is a period including a period during which the State Of Charge (SOC) of the electric storage unit is greater than 80%, or a period including a period during which the Depth Of Discharge (DOD) of the electric storage unit is less than 20%.

(3)
The control apparatus according to (1) or (2), wherein the determination unit compares a voltage indicated by the voltage information with a reference voltage, and determines that there is a deterioration of the electric storage unit in accordance with a time during which the voltage is greater than the reference voltage.

(4)
The control apparatus according to (3), wherein
current information related to a load current upon connection of a load to the electric storage unit is input into the input unit, and
an acquisition unit configured to acquire the reference voltage corresponding to the current information is included.

(5)
The control apparatus according to (4), including a storage unit configured to store a reference voltage corresponding to a load current, wherein the acquisition unit reads the reference voltage corresponding to the current information from the storage unit.

(6)
The control apparatus according to any of (1) to (5), wherein the determination unit determines the degree of the deterioration of the electric storage unit in accordance with a time during which the voltage is greater than the reference voltage.

(7)
The control apparatus according to (1) or (2), wherein the determination unit
calculates the ratio of the amount of a change in the capacity of the electric storage unit to the amount of a change in the potential, and
upon a plurality of maximum values that the ratio is greater than a predetermined value being detected in the early stage of the discharge, determines that there is a deterioration of the electric storage unit.

(8)
The control apparatus according to (7), wherein the degree of the deterioration of the electric storage unit is determined in accordance with a timing when the maximum value is detected.

(9)
The control apparatus according to any of (1) to (8), wherein the determination unit makes the determination upon at least one of the number of charges and a charging time being greater than a threshold value at a temperature less than 0° C.

(10)
The control apparatus according to any of (1) to (9), wherein a predetermined notification process is performed upon determining that there is a deterioration of the electric storage unit.

(11)
The control apparatus according to any of (1) to (10), wherein charge and discharge of the electric storage unit are prohibited upon determining that there is a deterioration of the electric storage unit.

(12)
The control apparatus according to any of (1) to (11), wherein one or a plurality of non-aqueous cells including an active material being able to occlude and release lithium in a positive electrode and a negative electrode is connected to form the electric storage unit.

(13)

The control apparatus according to (12), wherein the determination unit determines whether or not the voltage indicated by the voltage information is a voltage occurring due to the precipitation of the lithium on a surface of the negative electrode and, upon being a voltage occurring due to the precipitation of the lithium on the negative electrode, determines that there is a deterioration of the electric storage unit.

(14)

A control method in a control apparatus, the control method including:

a plurality of pieces of voltage information related to a potential of an electric storage unit upon discharge being input; and using the voltage information in an early stage of the discharge and determining the presence or absence of a deterioration of the electric storage unit.

(15)

A power supply system including:

one or a plurality of electric storage units;

an output unit configured to acquire a voltage of the electric storage unit upon discharge, and output voltage information related to the acquired voltage;

an input unit to which a plurality of pieces of the voltage information are input; and a determination unit configured to use the voltage information in an early stage of the discharge and determine the presence or absence of a deterioration of the electric storage unit.

(16)

An electric-powered vehicle including the control apparatus according to (1).

<6. Application Examples>

[Power Storage Apparatus in House as Application Example]

Figure 11:
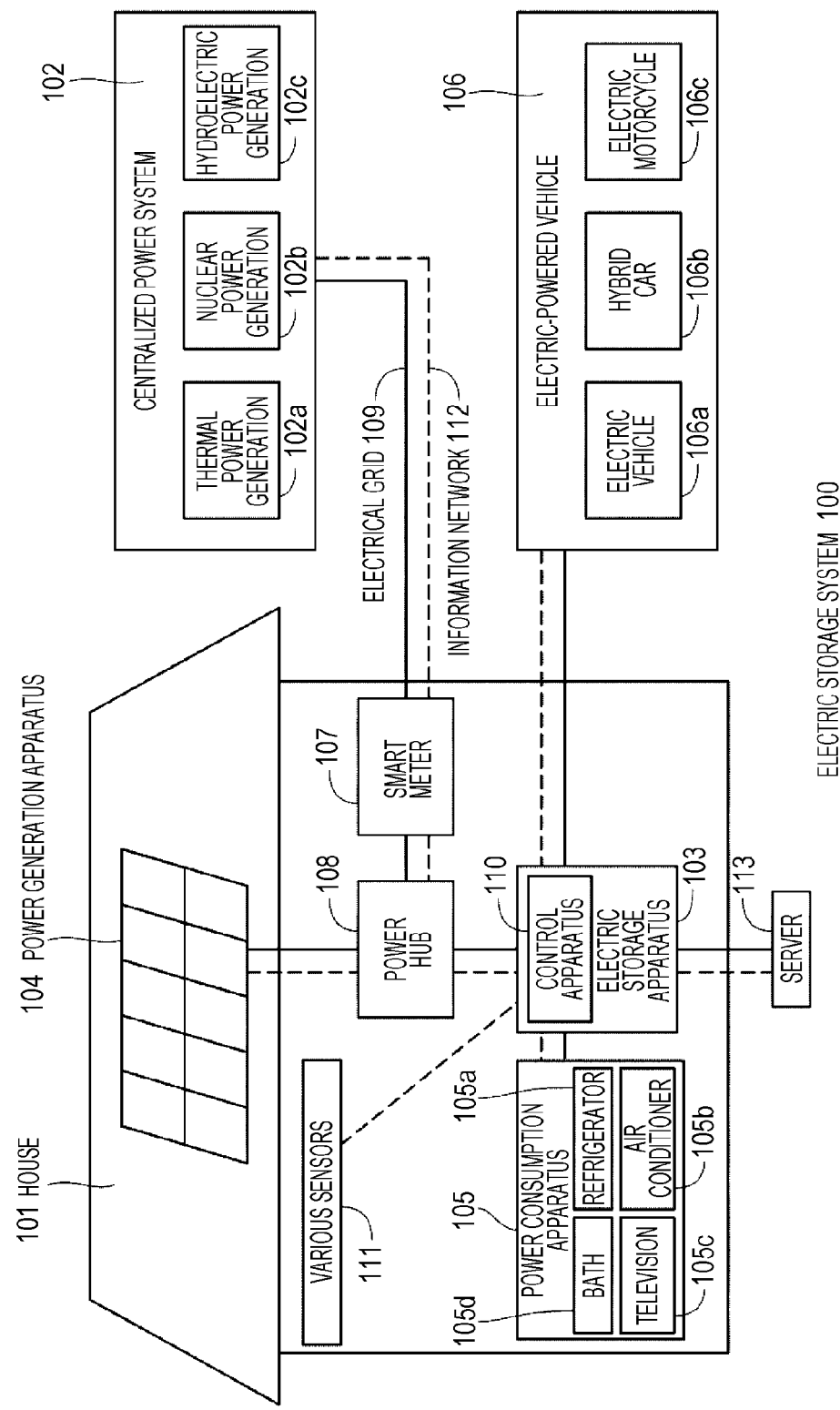
FIG. 11 is a diagram illustrating an application example.

An example where the present disclosure is applied to a power storage apparatus for a house is described with reference to FIG. 11. For example, in a power storage apparatus 100 for a house 101, electric power is supplied from a centralized power system 102 such as thermal power generation 102a, nuclear power generation 102b, and hydroelectric power generation 102c to an electric storage apparatus 103 via an electrical grid 109, an information network 112, a smart meter 107, a power hub 108, and the like. Together with this, electric power is supplied from an independent source such as a home power generation apparatus 104 to the electric storage apparatus 103. The power supplied to the electric storage apparatus 103 is stored. The electric storage apparatus 103 is used to supply power to be used in the house 101. A similar power storage apparatus can be used for not limited to the house 101 but also a building.

The electric storage apparatus 103 can also be installed indoor, and also outdoor in some instances. The outdoor temperature in the winter may be decreased to approximately −20° C. in low temperature areas such as Hokkaido. Even if the electric storage apparatus 103 is continuously used under such an environment, the state of the electric storage apparatus 103 can be distinguished correctly by the present technology.

The home power generation apparatus 104, a power consumption apparatus 105, the electric storage apparatus 103, a control apparatus 110 that controls each apparatus, the smart meter 107, and sensors 111 that acquire various pieces of information are provided to the house 101. Each apparatus is connected to the electrical grid 109 and the information network 112. A solar cell, a fuel cell, and the like are used as the home power generation apparatus 104. The generated power is supplied to the power consumption apparatus 105 and/or the electric storage apparatus 103. The power consumption apparatus 105 includes a refrigerator 105a, an air conditioning apparatus 105b, a television receiver 105c, and a bath 105d. Furthermore, the power consumption apparatus 105 includes an electric-powered vehicle 106. The electric-powered vehicle 106 includes an electric vehicle 106a, a hybrid car 106b, and an electric motorcycle 106c.

The electric storage apparatus 103 includes a secondary battery or capacitor. For example, it includes a lithium-ion secondary battery. The above-mentioned electric storage module 2 or electric storage module 4 can be used as the electric storage apparatus 103. The lithium-ion secondary battery may be fixed, or used in the electric-powered vehicle 106. The smart meter 107 has the function of measuring the amount of use of commercial power and transmitting the measured amount of use to a power company. The electrical grid 109 may combine one or a plurality of direct current power supply, alternating current power supply, and contactless power supply.

The various sensors 111 are, for example, a motion detector, an illumination sensor, an object detection sensor, a power consumption sensor, a vibration sensor, a contact sensor, a temperature sensor, and an infrared sensor. Information acquired by the various sensors 111 is transmitted to the control apparatus 110. The state of the weather, the state of a human, and the like are grasped based on the information from the sensors 111, which makes it possible to automatically control the power consumption apparatus 105 and minimize energy consumption. Furthermore, the control apparatus 110 can transmit information on the house 101 to an external power company or the like via the Internet.

The power hub 108 performs processes such as the branching of a power line and DC-AC conversion. Examples of a communication method of the information network 112 connected to the control apparatus 110 include a method that uses a communication interface such as a Universal Asynchronous Receiver-Transmitter (UART): asynchronous receiver/transmitter circuit for serial communication), or a method that uses a sensor network by a wireless communication standard such as Bluetooth (registered trademark), ZigBee (registered trademark), or Wi-Fi (registered trademark). The Bluetooth method is applied to multimedia communication, and communication can be performed on one-to-many connection. ZigBee uses the physical layer of Institute of Electrical and Electronics Engineers (IEEE) 802.15.4. IEEE 802.15.4 is a name of a short-range wireless network standard called Personal Area Network (PAN) or Wireless (W) PAN.

The control apparatus 110 is connected to an external server 113. The server 113 may be managed by any of the house 101, the power company, and a service provider. Information to be transmitted/received by the server 113 is, for example, power consumption information, life pattern information, an electric power charge, weather information, natural disaster information, and information related to electricity trade. These pieces of information may be transmitted/received from a home power consumption apparatus (for example, a television receiver), or may be transmitted/received from an apparatus outside a home (for example, a mobile phone). These pieces of information may be displayed on a device having a display function, for example, a television receiver, a mobile phone, and a Personal Digital Assistants (PDA).

The control apparatus 110 that controls each unit includes a CPU, RAM, and ROM, and is housed in the electric storage apparatus 103 in the example. The function of each unit of the electric storage module 2, for example, the sub micro control unit 25, can be applied as the function of the control apparatus 110. The control apparatus 110 is connected by the information network 112 to the electric storage apparatus 103, the home power generation apparatus 104, the power consumption apparatus 105, the various sensors 111, and the server 113 and has, for example, the function of adjusting the amount of use of commercial power and the amount of power generation. In addition, the function of trading electricity in an electricity market, and the like may be included.

As described above, in terms of power, power generated by not only the centralized power system 102 such as the thermal power generation 102a, the nuclear power generation 102b, and the hydroelectric power generation 102c but also the home power generation apparatus 104 (solar power generation, wind power generation) can be stored in the electric storage apparatus 103. Therefore, even if the power generated by the home power generation apparatus 104 fluctuates, control, such as stabilizing the amount of power to be transmitted to the outside or discharging by a necessary amount, can be performed. There is also usage that for example, the power obtained by solar power generation is stored in the electric storage apparatus 103, and also night-time electric power, which is cheaper, is stored in the electric storage apparatus 103 during the night, and the power stored by the electric storage apparatus 103 is discharged and used in the daytime period during which the rate is high.

In this example, the example where the control apparatus 110 is housed in the electric storage apparatus 103 has been described. However, the control apparatus 110 may be housed in the smart meter 107 or may be formed alone. Furthermore, the power storage apparatus 100 may be used targeting a plurality of homes in an apartment, or may be used targeting a plurality of detached houses.

[Power Storage Apparatus in Vehicle as Application Example]

Figure 12:
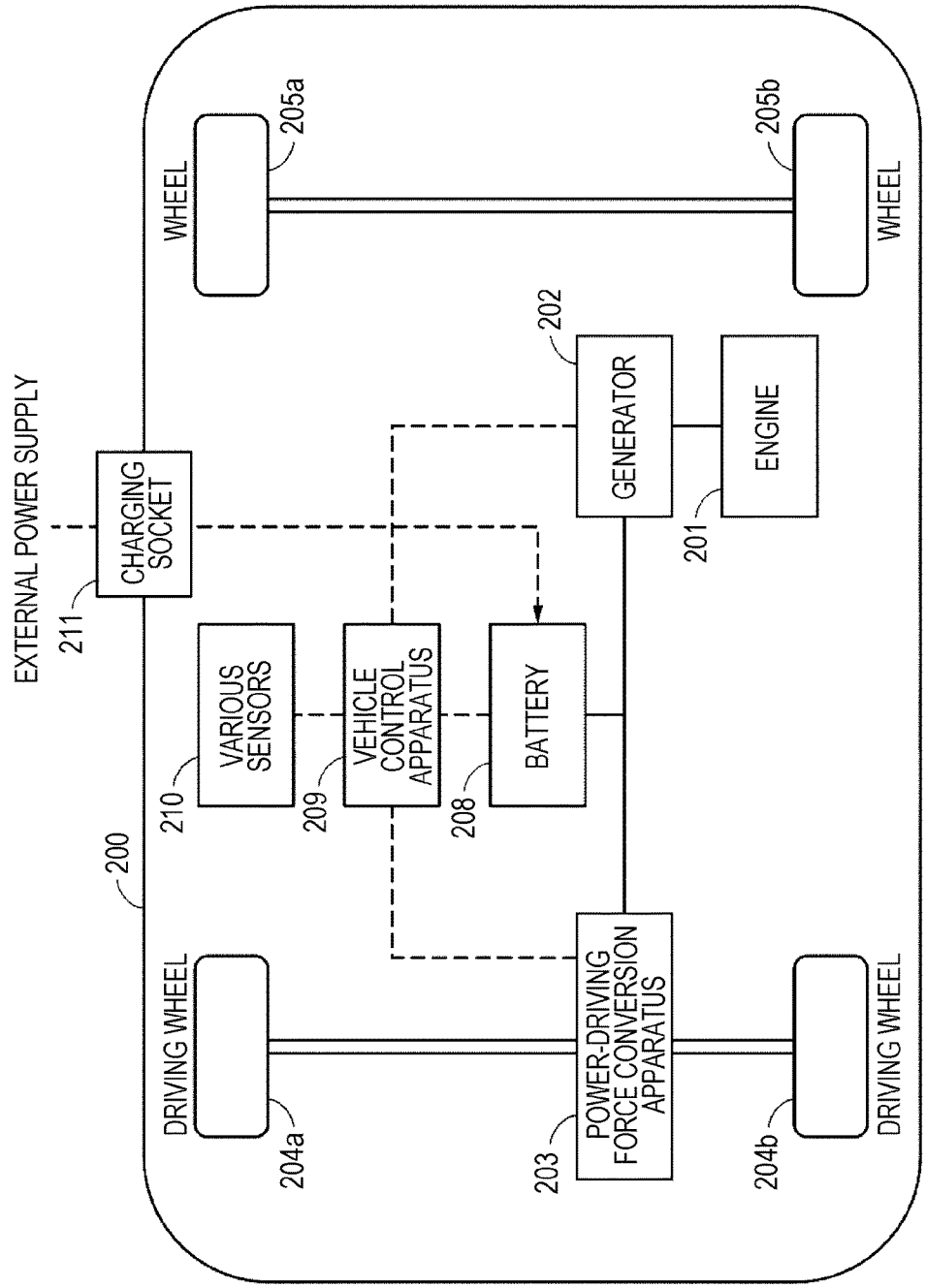
FIG. 12 is a diagram illustrating an application example.

An example where the present disclosure is applied to a power storage apparatus for a vehicle is described with reference to FIG. 12. FIG. 12 schematically illustrates an example of the configuration of a hybrid vehicle that adopts a series hybrid system to which the present disclosure is applied. The series hybrid system is a vehicle that uses power generated by a generator operated by an engine, or power being the generated power temporarily stored in a battery, and runs on a power-driving force conversion apparatus.

An engine 201, a generator 202, a power-driving force conversion apparatus 203, a drive wheel 204a, a drive wheel 204b, a wheel 205a, a wheel 205b, a battery 208, a vehicle control apparatus 209, various sensors 210, and a charging socket 211 are installed in the hybrid vehicle 200. The electric storage module 2 or 4 can be applied as the battery 208.

The hybrid vehicle 200 is stored outdoor in many cases. The outside temperature may decrease to approximately −20° C. in the intermontane area in the winter. Even if the battery 208 is continuously used under such an environment, the state of the battery 208 can be distinguished correctly by the present technology.

The hybrid vehicle 200 runs with the power-driving force conversion apparatus 203 as a power source. An example of the power-driving force conversion apparatus 203 is a motor. The power-driving force conversion apparatus 203 is operated by the power of the battery 208. The rotational force of the power-driving force conversion apparatus 203 is transmitted to the drive wheels 204a and 204b. Direct current-alternating current (DC-AC) or reverse conversion (AC-DC conversion) is used at a necessary place and accordingly it is applicable even if the power-driving force conversion apparatus 203 is an AC motor or DC motor. The various sensors 210 control the engine speed via the vehicle control apparatus 209 and control the opening degree of an unillustrated throttle valve (throttle opening). The various sensors 210 include a speed sensor, an accelerometer, and an engine speed sensor.

The rotational force of the engine 201 is transmitted to the generator 202. Power generated by the generator 202 based on the rotational force can be stored in the battery 208.

When the hybrid vehicle is decelerated by an unillustrated brake mechanism, resistance force upon the deceleration is added as the rotational force to the power-driving force conversion apparatus 203. Regenerative power generated by the power-driving force conversion apparatus 203 based on the rotational force is stored in the battery 208.

The battery 208 is connected to an external power supply of the hybrid vehicle. Accordingly, the battery 208 can be supplied with electric power from the external power supply, using the charging socket 211 as an input port, and store the supplied power.

Although not illustrated, an information processing apparatus that performs information processing related to the control of the vehicle based on information related to a secondary cell may be included. Examples of such an information processing apparatus include an information processing apparatus that displays the remaining capacity of a battery based on information related to the remaining capacity of the battery.

As the function of the vehicle control apparatus 209, the functions of the units of the electric storage module 2, for example, the sub micro control unit 25, can be applied.

The above description has been given taking, as an example, a series hybrid vehicle that uses power generated by a generator operated by an engine, or power being the generated power temporarily stored in a battery, and runs on a motor. However, the present disclosure can be effectively applied also to a parallel hybrid vehicle in which both of the outputs of the engine and the motor act as driving sources and three systems of running only on the engine, running only on the motor, running on the engine and the motor are appropriately switched and used. Furthermore, the present disclosure can also be effectively applied to what is called an electric-powered vehicle that runs with the drive of only the driving motor without the use of the engine.

REFERENCE SIGNS LIST 1, 10 Power supply system
2, 4 Electric storage module
3, 5 Controller
13 voltage multiplexer
14, 21 ADC
17 Monitoring unit
19 Current detection resistor
20 Current detection amplifier
25 Sub micro control unit
25a Determination unit
27 Storage unit
30 Main micro control unit
38 Storage unit

The invention claimed is:

1. A control apparatus, comprising:
a Central Processing Unit (CPU) configured to:
receive a plurality of pieces of voltage information related to a voltage of one or more batteries upon discharge;
use the plurality of pieces of voltage information in an early stage of the discharge;
calculate a ratio of an amount of change in capacity of the one or more batteries to an amount of change in a potential of the one or more batteries; and
determine presence or absence of a deterioration of the one or more batteries based on detection of a plurality of maximum values of the calculated ratio that are greater than a first threshold value in the early stage of the discharge.

2. The control apparatus according to claim 1, wherein the early stage of the discharge is a period that includes a period during which the State Of Charge (SOC) of the one or more batteries is greater than 80%, or a period that includes a period during which the Depth Of Discharge (DOD) of the one or more batteries is less than 20%.

3. The control apparatus according to claim 1, wherein the CPU is further configured to:
compare the voltage indicated by the plurality of pieces of voltage information with a reference voltage; and
determine that there is the deterioration of the one or more batteries in accordance with a time during which the voltage is greater than the reference voltage.

4. The control apparatus according to claim 3, wherein the CPU is further configured to:
receive a current information related to a load current upon connection of a load to the one or more batteries; and
acquire the reference voltage that corresponds to the received current information.

5. The control apparatus according to claim 4, further comprising a memory configured to store the reference voltage that corresponds to the received current information, wherein the CPU is further configured to read the reference voltage that corresponds to the received current information from the memory.

6. The control apparatus according to claim 3, wherein the CPU is further configured to determine a degree of the deterioration of the one or more batteries in accordance with the time during which the voltage is greater than the reference voltage.

7. The control apparatus according to claim 1, wherein a degree of the deterioration of the one or more batteries is determined in accordance with a timing at which maximum value is detected.

8. The control apparatus according to claim 1, wherein the CPU is further configured to determine the presence or absence of the deterioration of the one or more batteries based on at least one of a number of charges or a charging time that is greater than a second threshold value at a temperature less than 0° C.

9. The control apparatus according to claim 1, wherein the CPU is further configured to generate a notification based on the determination of the deterioration of the one or more batteries.

10. The control apparatus according to claim 1, wherein charge and discharge of the one or more batteries are prohibited upon determination of the deterioration of the one or more batteries.

11. The control apparatus according to claim 1, wherein one or more non-aqueous cells that include an active material that is ale to occlude and release lithium in a positive electrode and a negative electrode is connected to form the one or more batteries.

12. The control apparatus according to claim 11, wherein the CPU is further configured to:
determine whether the voltage indicated by the plurality of pieces of voltage information is a voltage that occurs due to precipitation of the lithium on a surface of the negative electrode; and
determine that there is the deterioration of the one or more batteries based on occurrence of a voltage due to the precipitation of the lithium on the surface of the negative electrode.

13. A control method in a control apparatus, the control method comprising:
receiving a plurality of pieces of voltage information related to a potential of one or more batteries upon discharge;
using the plurality of pieces of voltage information in an early stage of the discharge; and
determining presence or absence of a deterioration of the one or more batteries based on a ratio of an amount of change in capacity of the one or more batteries to an amount of a change in the potential of the one or more batteries.

14. A power supply system, comprising:
one or more batteries; and
a Central Processing Unit (CPU) configured to:
acquire a voltage of the one or more batteries upon discharge, and output a voltage information related to the acquired voltage;
use the voltage information in an early stage of the discharge; and
determine presence or absence of a deterioration of the one or more batteries based on a ratio of an amount of change in capacity of the one or more batteries to an amount of a change in a potential of the one or more batteries.

15. An electric-powered vehicle, comprising:
a control apparatus comprising:
a Central Processing Unit (CPU) configured to:
receive a plurality of pieces of voltage information related to a voltage of one or more batteries upon discharge;
use the plurality of pieces of voltage information in an early stage of the discharge;
calculate a ratio of an amount of change in capacity of the one or more batteries to an amount of a change in a potential of the one or more batteries; and
determine presence or absence of a deterioration of the one or more batteries based on detection of a plurality of maximum values of the calculated ratio that are greater than a first threshold value in the early stage of the discharge.

* * * * *